US011728291B2

(12) United States Patent
Liao et al.

(10) Patent No.: US 11,728,291 B2
(45) Date of Patent: Aug. 15, 2023

(54) SEMICONDUCTOR ARRANGEMENT IN FAN OUT PACKAGING INCLUDING MAGNETIC STRUCTURE AROUND TRANSMISSION LINE

(71) Applicant: Taiwan Semiconductor Manufacturing Company Limited, Hsin-Chu (TW)

(72) Inventors: Wen-Shiang Liao, Toufen Township (TW); Huan-Neng Chen, Taichung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 16/397,347

(22) Filed: Apr. 29, 2019

(65) Prior Publication Data

US 2019/0326235 A1    Oct. 24, 2019

Related U.S. Application Data

(62) Division of application No. 15/464,953, filed on Mar. 21, 2017, now Pat. No. 10,276,518.

(51) Int. Cl.
*H01L 23/522* (2006.01)
*H01L 23/66* (2006.01)
(Continued)

(52) U.S. Cl.
CPC .............. *H01L 23/66* (2013.01); *H01L 21/56* (2013.01); *H01L 21/568* (2013.01); *H01L 21/6836* (2013.01); *H01L 23/3128* (2013.01);

*H01L 23/3192* (2013.01); *H01L 23/5225* (2013.01); *H01L 23/5227* (2013.01);
(Continued)

(58) Field of Classification Search
CPC . H01L 23/66; H01L 23/5225; H01L 23/5227; H01L 23/10; H01L 2224/02379; H01L 23/3192; H01L 2224/18; H01L 23/5222; H01L 23/528; H01L 23/5283; H03F 3/195; H03F 2200/91; H03F 2200/451
See application file for complete search history.

(56) References Cited

U.S. PATENT DOCUMENTS 3,780,219 A  *  12/1973  O'Toole .................... H03L 7/08
                                                    348/654
4,776,087 A  *  10/1988  Cronin ................ H01L 23/5384
                                                    257/E23.174
(Continued)

*Primary Examiner* — Sophia T Nguyen
*Assistant Examiner* — John Lin
(74) *Attorney, Agent, or Firm* — Cooper Legal Group, LLC

(57) ABSTRACT

A semiconductor arrangement in fan out packaging has a molding compound adjacent a side of a semiconductor die. A magnetic structure is disposed above the molding compound, above the semiconductor die, and around a transmission line coupled to an integrated circuit of the semiconductor die. The magnetic structure has a top magnetic portion, a bottom magnetic portion, a first side magnetic portion, and a second side magnetic portion. The first side magnetic portion and the second side magnetic portion are coupled to the top magnetic portion and to the bottom magnetic portion. The first side magnetic portion and the second side magnetic portion have tapered sidewalls.

20 Claims, 29 Drawing Sheets

(51) Int. Cl.
*H03F 3/195* (2006.01)
*H01L 23/31* (2006.01)
*H01L 21/56* (2006.01)
*H01L 21/683* (2006.01)
*H01L 23/00* (2006.01)

(52) U.S. Cl.
CPC .............. *H01L 24/02* (2013.01); *H01L 24/19* (2013.01); *H01L 24/20* (2013.01); *H03F 3/195* (2013.01); *H01L 2221/6834* (2013.01); *H01L 2221/68327* (2013.01); *H01L 2221/68372* (2013.01); *H01L 2221/68381* (2013.01); *H01L 2224/18* (2013.01); *H03F 2200/451* (2013.01); *H03F 2200/91* (2013.01)

(56) References Cited

U.S. PATENT DOCUMENTS

| | | | | |
|---|---|---|---|---|
| 2002/0019075 | A1* | 2/2002 | Brand | H01L 24/11 |
| | | | | 438/108 |
| 2008/0272837 | A1* | 11/2008 | Welland | H03L 7/18 |
| | | | | 327/551 |
| 2012/0013019 | A1* | 1/2012 | Sakamoto | H01L 23/5225 |
| | | | | 257/774 |
| 2012/0212316 | A1* | 8/2012 | Cho | H01L 23/5227 |
| | | | | 336/84 M |
| 2015/0102472 | A1* | 4/2015 | Tsai | H01L 23/552 |
| | | | | 257/659 |
| 2015/0177310 | A1* | 6/2015 | Roehner | H01L 22/34 |
| | | | | 324/762.01 |
| 2015/0364462 | A1* | 12/2015 | Nakaiso | H01L 27/0292 |
| | | | | 257/751 |

\* cited by examiner

SEMICONDUCTOR ARRANGEMENT IN FAN OUT PACKAGING INCLUDING MAGNETIC STRUCTURE AROUND TRANSMISSION LINE

RELATED APPLICATIONS

This application is a divisional of and claims priority to U.S. patent application Ser. No. 15/464,953, titled, "SEMICONDUCTOR ARRANGEMENT IN FAN OUT PACKAGING INCLUDING MAGNETIC STRUCTURE AROUND TRANSMISSION LINE" and filed on Mar. 21, 2017, which is incorporated herein by reference.

BACKGROUND

In semiconductor arrangements various layers of conductive material are separated from one another by dielectric or non-conductive layers. Electrically conductive vias are formed within or through the dielectric layers to selectively couple different conductive layers to one another. A transmission line similarly couples electrical components within one or more semiconductor arrangements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
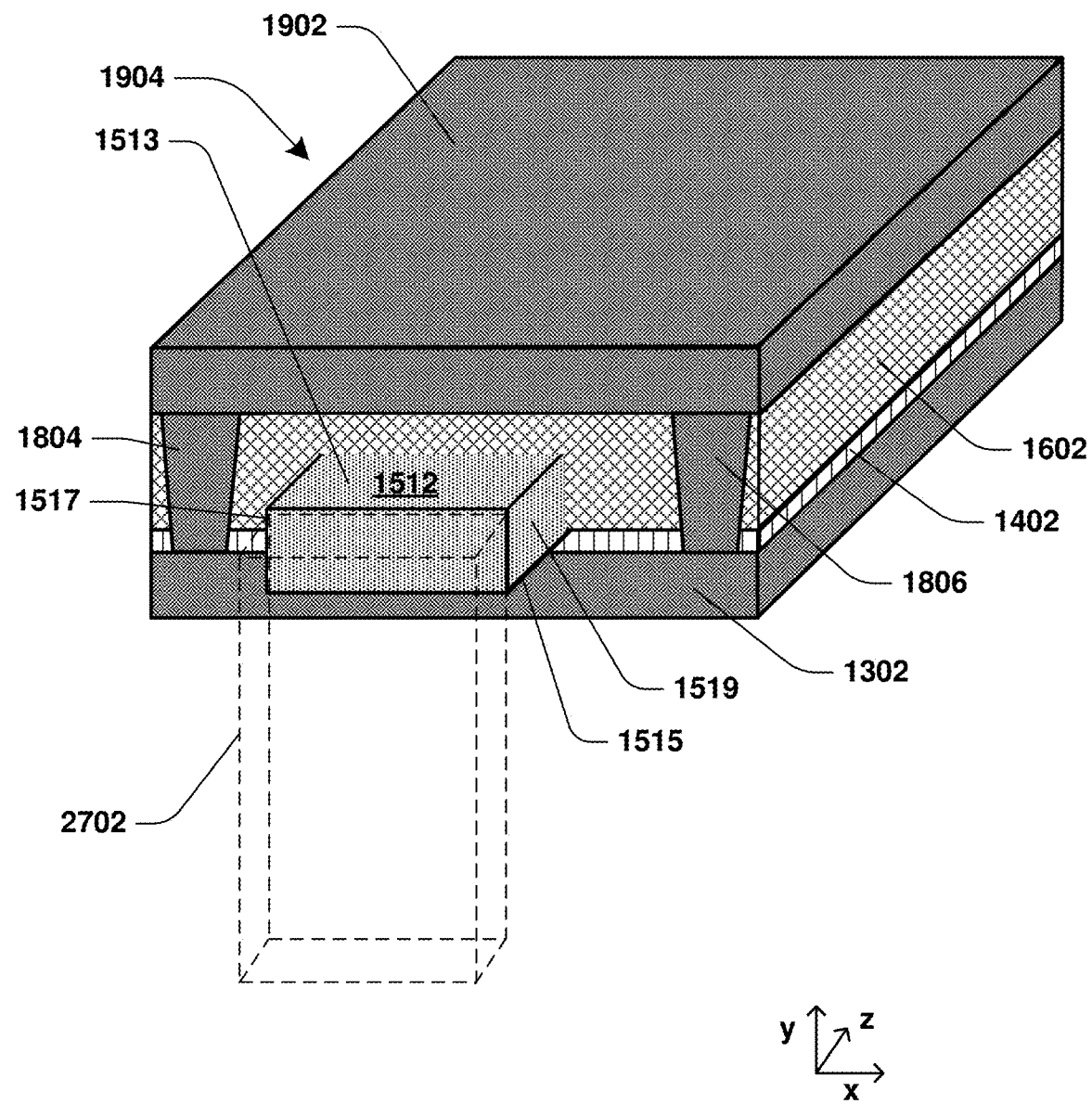
FIG. 1 is an illustration of a perspective view of a semiconductor arrangement, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor dies are formed on a wafer, where each die may contain one or more integrated circuits such as relating to at least one of memory, processor(s), or other semiconductor component(s). The semiconductor dies are diced out and removed from the wafer. According to one or more embodiments, the semiconductor dies are cut from the wafer by a saw, such as a diamond saw, and a die attach film (DAF) serves to maintain a relative position between the semiconductor dies during the dicing and removal process. According to one or more embodiments, the saw cuts along scribe lines on the wafer to remove the semiconductor dies from the wafer and to separate the semiconductor dies from one another. According to one or more embodiments, the wafer, and thus one or more of the semiconductor dies removed therefrom, may comprise at least one of silicon, germanium, silicon on insulator (SOI), or one or more epitaxial layers.

In one or more embodiments, known good dies are placed upon a carrier. According to one or more embodiments, the carrier may be a glass substrate or other material. According to one or more embodiments, merely semiconductor dies that meet one or more quality metrics, and are therefore referred to as known good dies, are placed on the carrier. By merely placing known good dies on the carrier, a decrease in yield may be mitigated because semiconductor arrangements that are formed on the known good dies are less likely to perform other than desired due to being formed on defective semiconductor dies.

According to one or more embodiments, an amount of space or distance between respective semiconductor dies is increased when the semiconductor dies are placed on the carrier as compared to when the semiconductor dies are initially formed on the wafer. According to one or more embodiments, the additional space between semiconductor dies may be a function of merely known good dies being placed on the carrier, such that not all semiconductor dies from the wafer may be transferred to the carrier. The additional space between semiconductor dies provides a larger footprint for making electrical connections to the semiconductor dies thereby affording fan out packaging.

The known good dies are embedded in a material, such as a molding compound, on the carrier. In one or more embodiments, the molding compound is formed over and around the semiconductor dies. In one or more embodiments, a top portion of the molding compound is removed to expose a top surface of the semiconductor dies. In one or more embodiments, conductive pads, at times referred to as interconnects, are exposed when the molding compound is removed to expose the top surface of the semiconductor dies. The additional area between the semiconductor dies allows an increased number of input/output (I/O) signal wires to fan out from interconnects of the semiconductor dies. The increased number of I/O signal wires affords, among other things, an increased pin count per semiconductor die, thus allowing more electrical connections, functionality, etc. to be realized from each semiconductor die. According to one or more embodiments, the additional area between semiconductor dies allows passive devices, such as inductors and capacitors, to be formed over the molding compound between semiconductor dies, which may result in lower substrate signal loss, where substrate signal loss can occur when passive devices are formed closer to a semiconductor substrate or closer to other components formed on the substrate.

FIG. 1 is an illustration of a perspective view of a transmission line 1512 that may be formed on a semiconductor die, such as one or more of the aforementioned dies, according to one or more embodiments. The transmission line 1512 may couple two or more components on the same semiconductor die or may couple one or more components on a first semiconductor die to one or more components on a second semiconductor die. In one or more embodiments, the transmission line couples a first component of a first integrated circuit to a second component of a second integrated circuit, such as a connection between a processor of a mobile device and memory of the mobile device. In FIG. 1 the transmission line 1512 extends into and out of the page in the z direction, and a first end of the transmission line 1512 is coupled to an electrically conductive interconnect 2702, according to one or more embodiments. The transmission line 1512 and the interconnect 2702 may both be on a same semiconductor die or the transmission line 1512 may be on one semiconductor die while the interconnect 2702 is on a different semiconductor die. The interconnect 2702 may provide a coupling to one or more components on a semiconductor die.

The transmission line 1512 is surrounded by one or more dielectric layers 1402, 1602, according to one or more embodiments, and thus some of the transmission line 1512 extending into the page in the z direction is not visible in FIG. 1 due to being obscured by the one or more dielectric layers 1402, 1602. A magnetic structure 1904 surrounds the transmission line 1512, with the one or more dielectric layers 1402, 1602 disposed between the transmission line 1512 and the magnetic structure 1904, according to one or more embodiments. The one or more dielectric layers 1402, 1602 electrically isolate the transmission line 1512 from the magnetic structure 1904, according to one or more embodiments. A top side 1513 of the transmission line 1512 is positioned relative, such as parallel, to a top magnetic portion 1902 of the magnetic structure 1904, according to one or more embodiments. A bottom side 1515 of the transmission line 1512 is positioned relative, such as parallel, to a bottom magnetic portion 1302 of the magnetic structure 1904, according to one or more embodiments. A first side 1517 of the transmission line 1512 faces a first side magnetic portion 1804 of the magnetic structure 1904, according to one or more embodiments. A second side 1519 of the transmission line 1512 faces a second side magnetic portion 1806 of the magnetic structure 1904, according to one or more embodiments. In one or more embodiments, the first side magnetic portion 1804 is positioned opposite the second side magnetic portion 1806 relative to the transmission line 1512. The one or more dielectric layers 1402, 1602 are formed along sidewalls of at least one of the first side magnetic portion 1804 or the second side magnetic portion 1806, according to one or more embodiments, and thus some of the first side magnetic portion 1804 and some of the second side magnetic portion 1806 extending into the page in the z direction are not visible in FIG. 1 due to being obscured by the one or more dielectric layers 1402, 1602.

Figure 2:
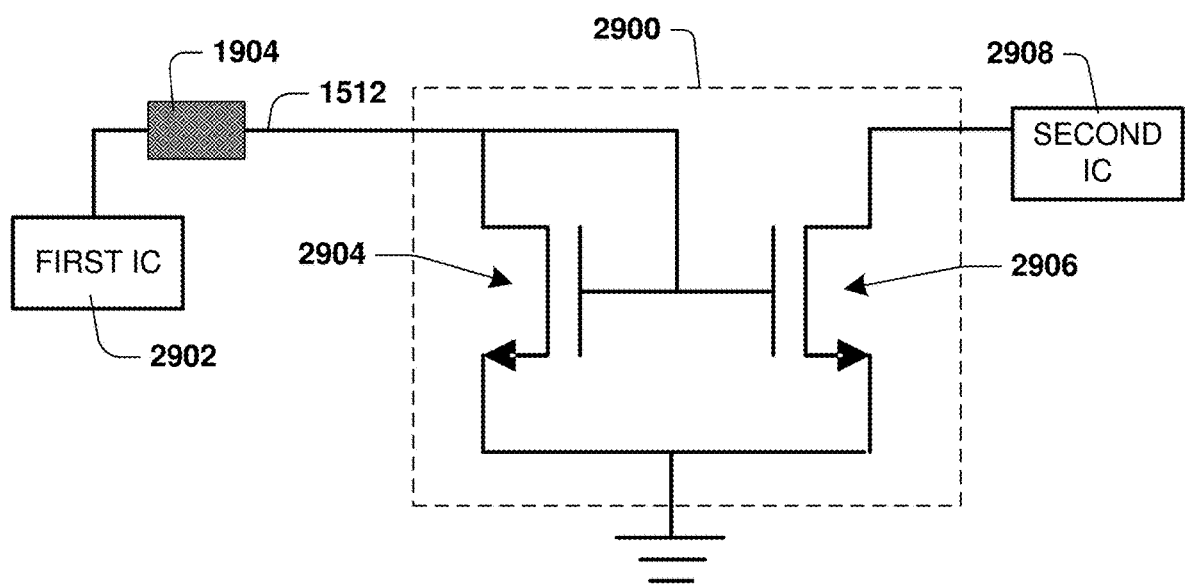
FIG. 2 is a schematic illustration of a semiconductor arrangement, in accordance with one or more embodiments.

FIG. 2 is a schematic illustration of a semiconductor arrangement that may be formed on a semiconductor die, such as one or more of the aforementioned dies, in accordance with one or more embodiments. In FIG. 2, the magnetic structure 1904 surrounds the transmission line 1512 and the transmission line 1512 is coupled to a first integrated circuit 2902, such as a processor of a mobile device, according to one or more embodiments. The transmission line 1512 is also coupled to a current amplifier 2900, according to one or more embodiments. In one or more embodiments, the transmission line 1512 is coupled to a first transistor 2904 of the current amplifier 2900. The current amplifier 2900 is coupled to a second integrated circuit 2908, such as memory of the mobile device, according to one or more embodiments. In one or more embodiments, a second transistor 2906 of the current amplifier 2900 is coupled to the second integrated circuit 2908. In one or more embodiments, the first integrated circuit 2902, the second integrated circuit 2908, the current amplifier 2900, and the transmission line 1512 and the magnetic structure 1904 may be on a same semiconductor die. In one or more embodiments, the first integrated circuit 2902, the second integrated circuit 2908, the current amplifier 2900, and the transmission line 1512 and the magnetic structure 1904 may each be on a different semiconductor die. In one or more embodiments, two or more of the first integrated circuit 2902, the second integrated circuit 2908, the current amplifier 2900, and the transmission line 1512 and the magnetic structure 1904 may be on a same semiconductor die.

According to one or more embodiments, the magnetic structure 1904 increases a characteristic impedance, such as an imaginary portion of impedance, of the transmission line 1512. Increasing the characteristic impedance of the transmission line 1512 reduces current consumption of the current amplifier 2900. Reducing current consumption of the current amplifier 2900 allows a length of the transmission line 1512 to be decreased, where a reduction in the length of the transmission line 1512 allows more devices to be formed on the same or a smaller area, which promotes a continuing desire to decrease the size of electronic devices. According to one or more embodiments, the length of the transmission line 1512 is measured in the z direction as illustrated in FIGS. 1 and 2. In one or more embodiments, if the magnetic structure 1904 is used to increase the characteristic impedance from about 50Ω to about 250Ω, then current consumption by the current amplifier is reduced from about 1.61 milliamps (mA) to about 322 microamps (μA).

In one or more embodiments, the increased characteristic impedance occurs according to equation (1) below.

$$Z_o = \sqrt{\frac{j\omega L + R}{j\omega C + G}} \quad (1)$$

In equation (1), $Z_o$ is the impedance of the transmission line 1512. j is an imaginary unit. ω is a function of a current applied to the transmission line 1512. L is the inductance due to a magnetic field surrounding the transmission line by the magnetic structure 1904. R is a resistance of the transmission line. C is the capacitance across the transmission line 1512, one or more dielectric layers separating the magnetic structure 1904 and the transmission line 1512, and the magnetic structure 1904. G is a conductance of the one or more dielectric layers 1402, 1602 separating the transmission line 1512 from the magnetic structure 1904. According to equation (1), the impedance ($Z_o$) is increased by increasing at least one of the inductance (L) or the resistance (R). In one or more embodiments, the addition of the magnetic structure 1904 increases the impedance ($Z_o$) by increasing the inductance (L) without increasing the resistance (R). In one or more embodiments, increasing a distance between the transmission line 1512 and a substrate, such as where the substrate comprises ground, increases the impedance ($Z_o$) by increasing the inductance (L) without increasing the resistance (R). In one or more embodiments, the resistance (R) is increased by decreasing a transmission line height of the transmission line 1512. According to one or more embodiments, the height of the transmission line 1512 is measured in the y direction as illustrated in FIGS. 1 and 2. In one or more embodiments, a semiconductor arrangement having the magnetic structure 1904 surrounding the transmission line 1512 has increased impedance ($Z_o$) without having increased resistance (R), as compared to a different semiconductor arrangement that does not have a magnetic structure 1904. In one or more embodiments, increased resistance (R) requires increased current or power, which may result in a shorter semiconductor arrangement life span than a semiconductor arrangement without the increased resistance. A transmission line having a resistance of about 50 ohms (Ω) or any other value may be used for components of integrated circuits. However, a transmission line having a resistance of about 50 ohms (Ω) may be less desirable for a radio frequency (RF) interconnect in fan out packaging because the current amplifier 2900 may consume a relatively high amount of current to meet a 50Ω matching due to lower input impedance of the transmission line and higher gain for the current amplifier. Larger and generally more costly metal oxide semiconductor (MOS) devices may be needed to accommodate the relatively high current, where increasing current increases power consumption. Reducing the size and power consumption of integrated circuits is generally desirable and may be difficult to achieve if larger MOS devices and higher current consumption are needed.

Figure 3:
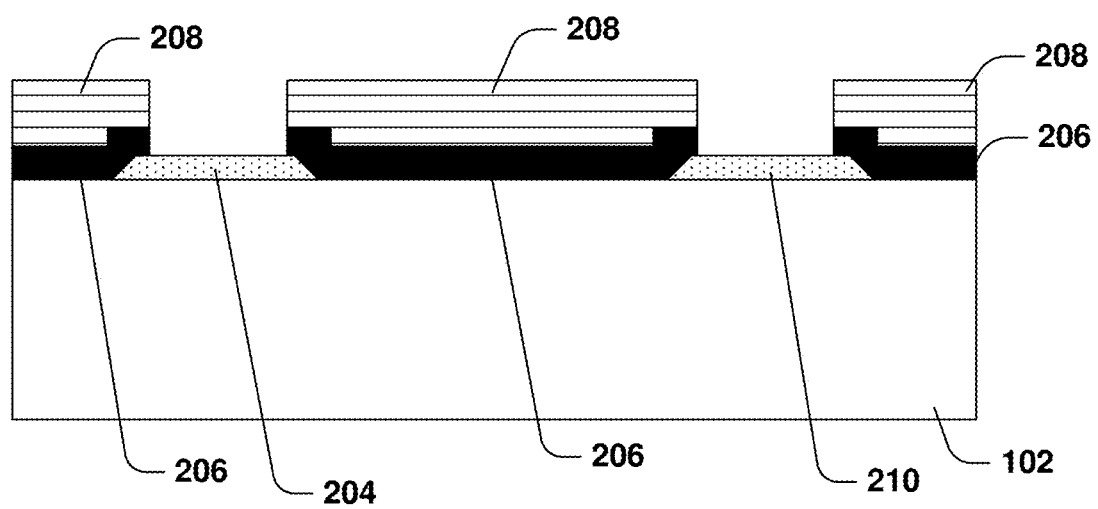
FIGS. 3-27 are illustrations of a semiconductor arrangement, at various stages of fabrication, in accordance with one or more embodiments.
Figure 3:
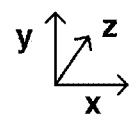

FIGS. 3-27 illustrate cross sectional views of a semiconductor arrangement, at various stages of fabrication, according to one or more embodiments. In one or more embodiments, the semiconductor arrangement is formed on a semiconductor die, such as one or more of the aforementioned dies associated with fan out packaging. FIG. 3 illustrates the semiconductor wafer 102 within which one or more semiconductor dies have been formed, such as semiconductor die of a mobile processor, memory, etc. At least one of a first conductive pad 204, such as a first aluminum pad, or a second conductive pad 210, such as a second aluminum pad, provide connectivity to one or more components of an integrated circuit within the semiconductor wafer 102.

In one or more embodiments, at least one of the first conductive pad 204 or the second conductive pad 210 have a length of about 50 micrometer (μm) to about 100 μm, as measured in at least one of the x direction or the z direction. In one or more embodiments, at least one of the first conductive pad 204 or the second conductive pad 210 comprises one or more conductive materials, such as aluminum, copper, gold, nickel, silver, tin, etc. According to one or more embodiments, one or more layers of conductive material are formed on the wafer 102 and patterned to form at least one of the first conductive pad 204 or the second conductive pad 210.

According to one or more embodiments, a passivation layer 206 is formed over the semiconductor wafer 102. In one or more embodiments, the passivation layer 206 comprises a dielectric such as at least one of oxide or nitride. In one or more embodiments, the passivation layer comprises at least one of oxide having a thickness of about 1 kiloangstroms (kA) to about 3 kA or nitride having a thickness of about 6 kA to about 10 kA, where thickness is measured in the y direction. According to one or more embodiments, the passivation layer 206 is formed over the wafer 102 and over at least one of the first conductive pad 204 or the second conductive pad 210. According to one or more embodiments, a photoresist 208 is patterned and used as a mask to allow portions of the passivation layer 206 over at least one of the first conductive pad 204 or the second conductive pad 210 to be removed, such as with an etchant, to reveal at least one of the first conductive pad 204 or the second conductive pad 210.

Figure 4:
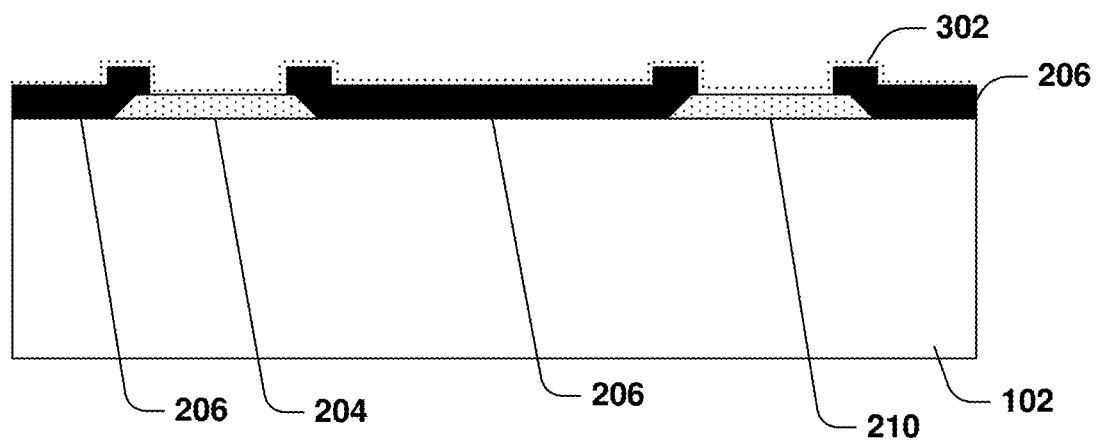
Figure 4:
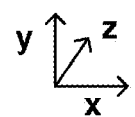
Figure 5:
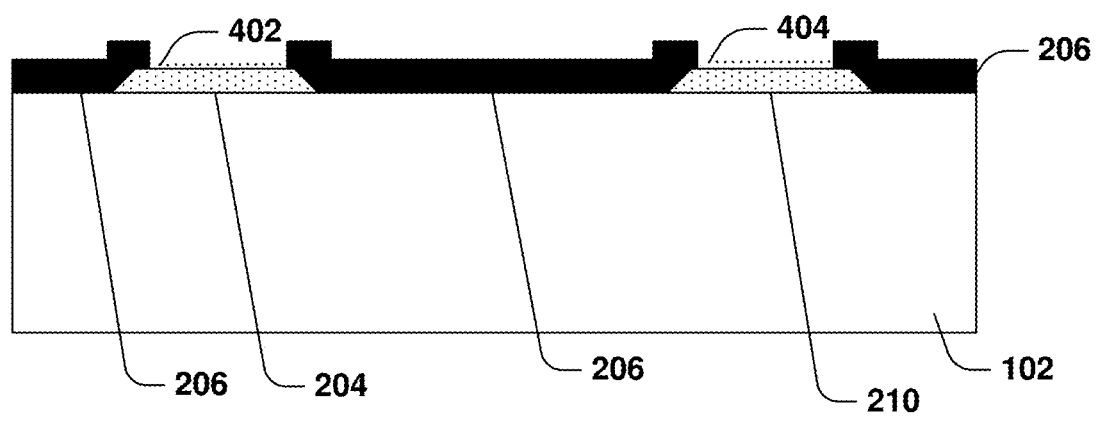
Figure 5:
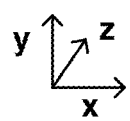

FIG. 4 illustrates the patterned photoresist removed and a seeding layer 302 formed over the passivation layer 206, the first conductive pad 204 and the second conductive pad 210, in accordance with one or more embodiments. The seeding layer 302 may be formed by a sputtering process, according to one or more embodiments. In one or more embodiments, the sputtering process uses a material comprising at least one of tin or copper (Ti/Cu) to form the seeding layer 302. In one or more embodiments, the seeding layer 302 is about 500 Å to about 3.5 kÅ thick. According to one or more embodiments, the seeding layer may be removed from the passivation layer 206, such as after photolithography definition and etching processes, so that a first seeding region 402 is subsequently defined over the first conductive pad 204 and a second seeding region 404 is also defined over the second conductive pad 210, as illustrated in FIG. 5.

Figure 6:
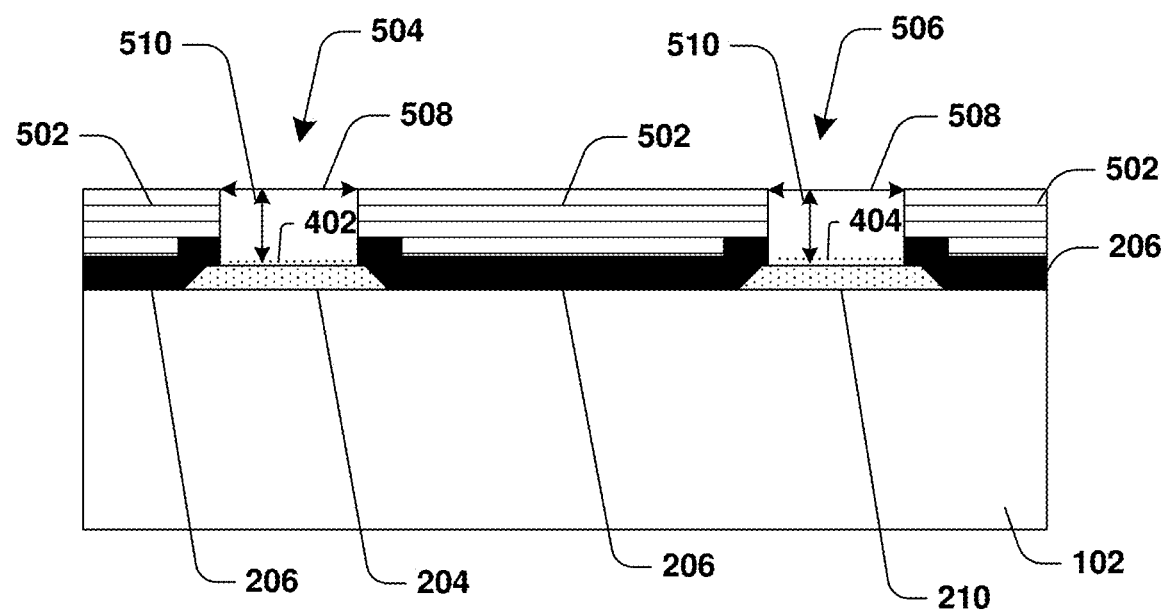
Figure 6:
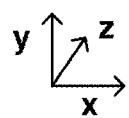

FIG. 6 illustrates a second photoresist 502 that is patterned to cover the passivation layer 206 but to define a first region 504 over the first seeding region 402 and a second region 506 over the second seeding region 404, according to one or more embodiments. At least one of the first region 504 or the second region 506 has a height 510 of about 15 μm to about 25 μm, according to one or more embodiments. At least one of the first region 504 or the second region 506 has a width 508 of about 20 μm to about 30 μm, according to one or more embodiments.

Figure 7:
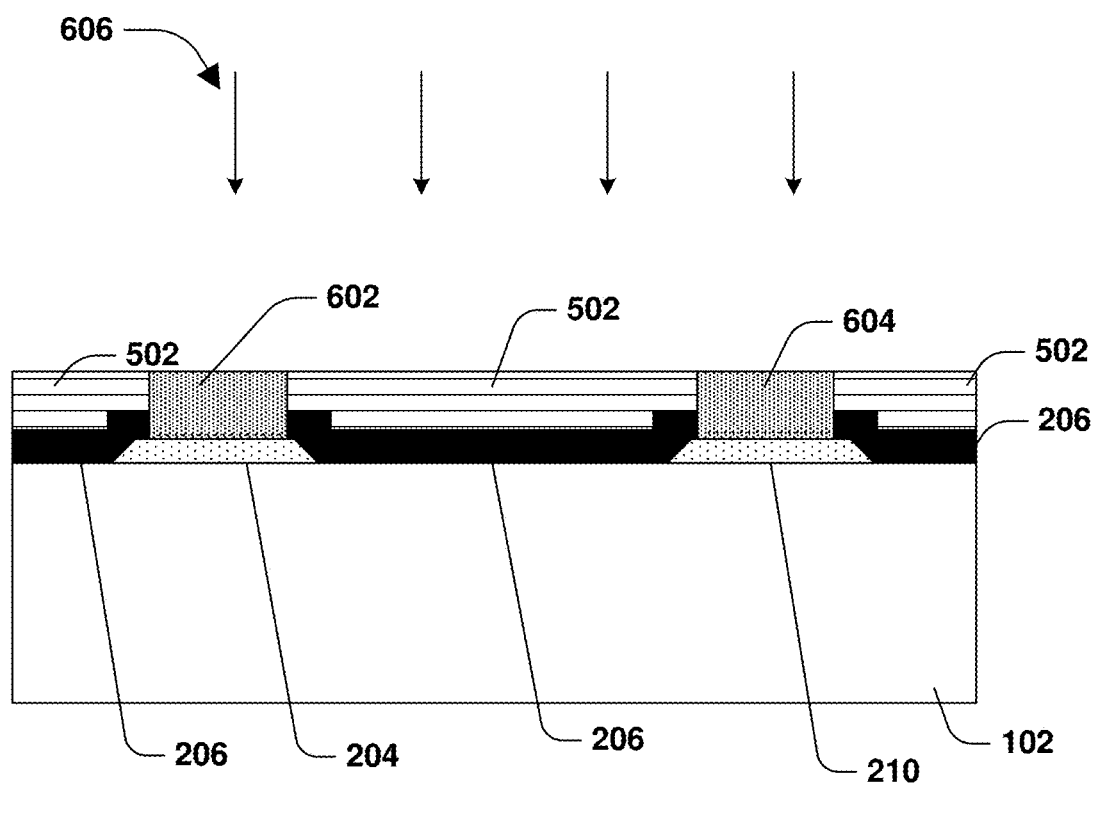

FIG. 7 illustrates an electrochemical plating process 606, such as a copper electrochemical plating process, that is used to grow, from the first seeding region 402, a first via connector 602 within the first region 504 over the first conductive pad 204, according to one or more embodiments. The electrochemical plating process 606 is used to grow, from the second seeding region 404, a second via connector 604 within the second region 506 over the second conductive pad 210, according to one or more embodiments. In one or more embodiments, the first via connector 602 and the second via connector 604 have heights and widths corresponding to the heights 510 and widths 508 of the first region 504 and the second region 506.

Figure 8:
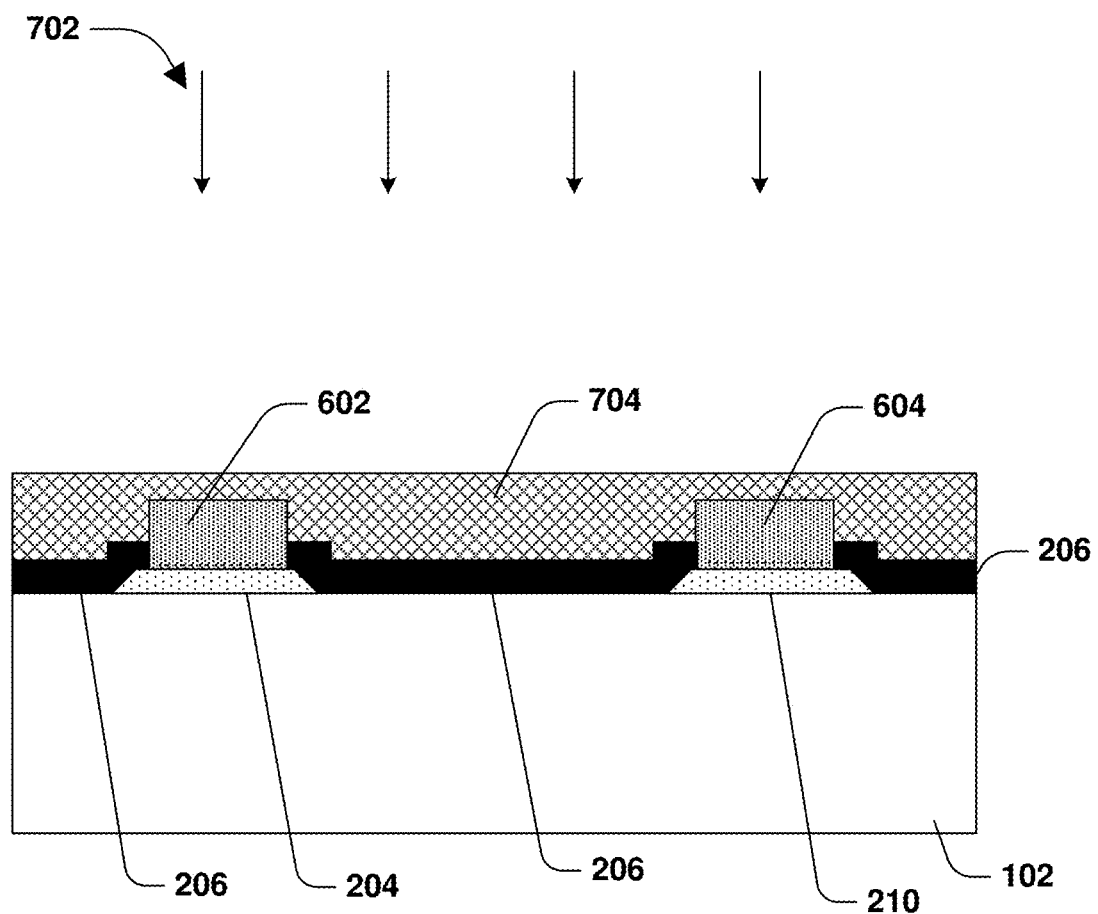

FIG. 8 illustrates the second photoresist removed and the formation of a first dielectric layer 704, according to one or more embodiments. The first dielectric layer 704 comprises a polymer, such as poly (p-phenylenebenzobisoxazole) (PBO), according to one or more embodiments. In one or more embodiments, the first dielectric layer 704 is formed using a spin-on process 702 that coats dielectric material over the passivation layer 206, the first via connector 602, and the second via connector 604. The first dielectric layer 704 is cured, such as at a temperature of about 100 Celsius (° C.) to about 150° C., according to one or more embodiments. In one or more embodiments, the first dielectric layer 704 will shrink from being cured. In one or more embodiments, the first dielectric layer 704 has a thickness of about 10 μm to about 20 μm.

Figure 9:
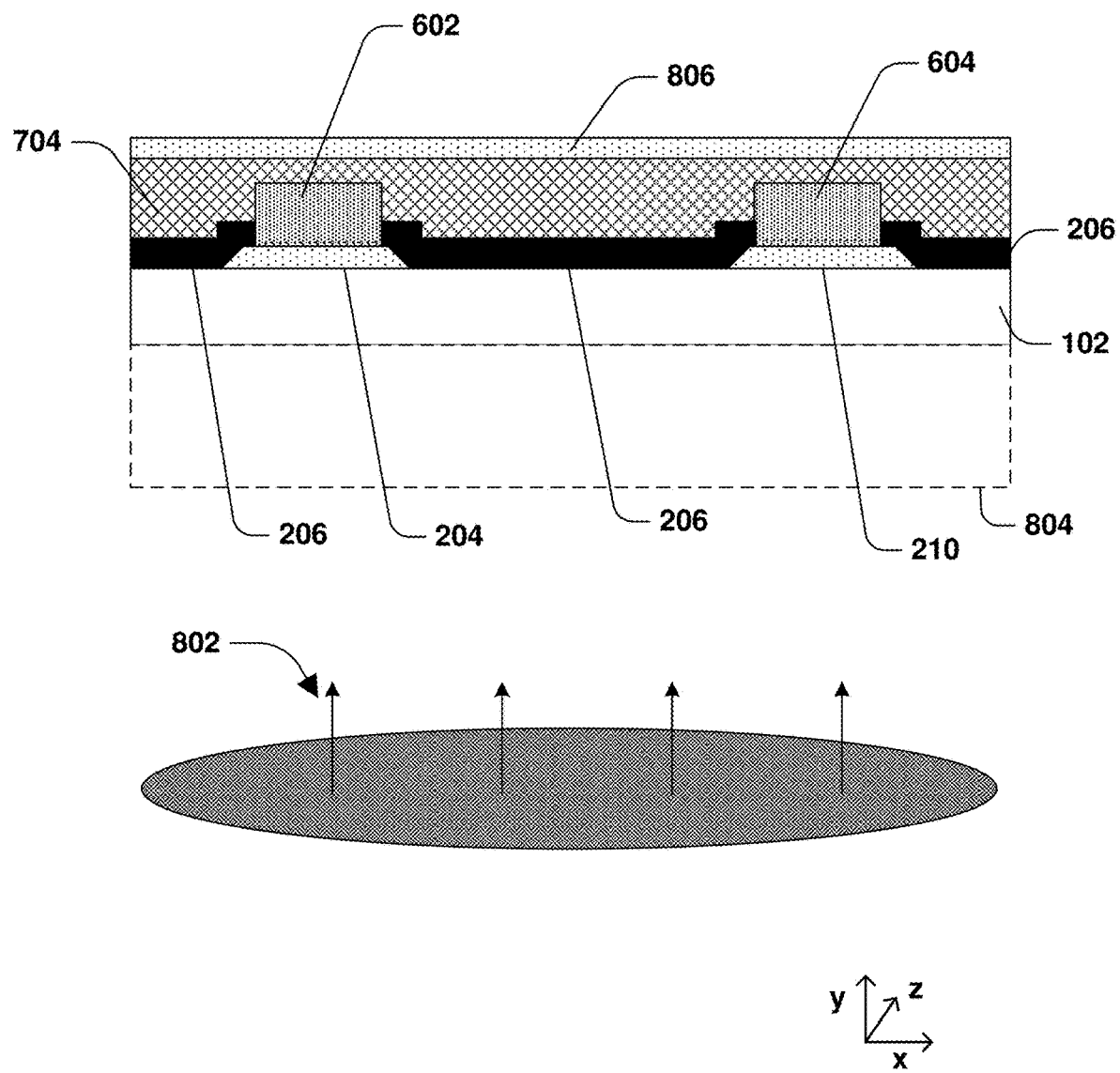

FIG. 9 illustrates a grinding process 802 that is used to grind the backside of the wafer 102, according to one or more embodiments. In one or more embodiments, a grinding tape 806 is applied over the first dielectric layer 704 to hold the semiconductor arrangement in place during the grinding process 802 or is used to attach the semiconductor arrangement to a machine that will spin the semiconductor arrangement against a grinding pad or other grinding component. The grinding process 802 removes a portion 804 of the wafer 102, according to one or more embodiments. In one or more embodiments, as a result of the grinding process, the wafer 102 is reduced from a thickness of about 750 µm or any other thickness to about 100 µm to about 250 µm.

Figure 10:
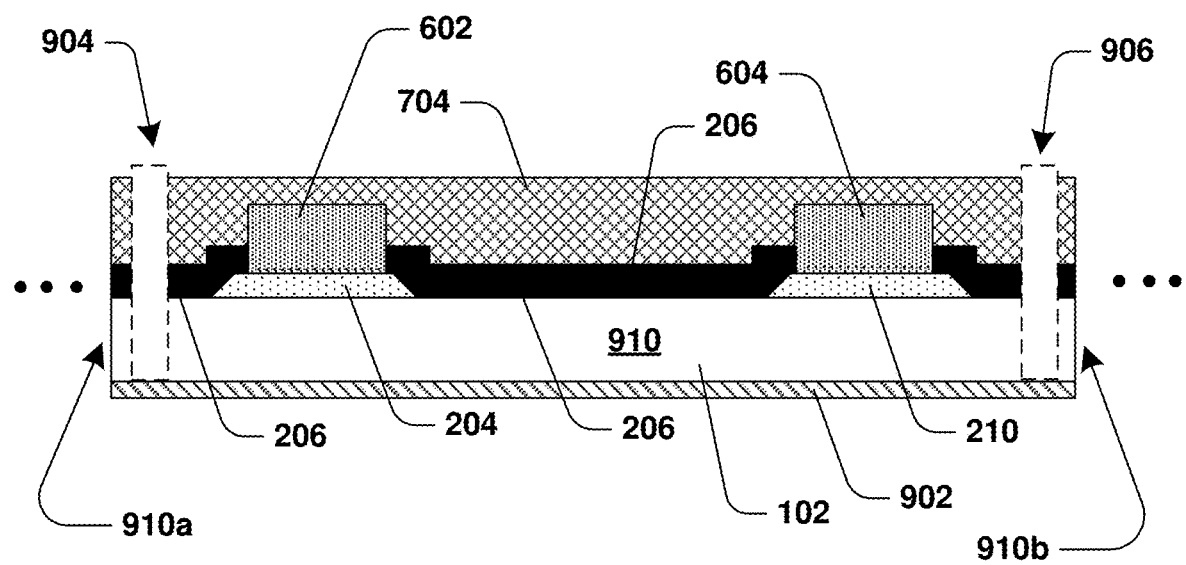

FIG. 10 illustrates separation of semiconductor dies 910 from the wafer 102, according to one or more embodiments. In one or more embodiments, a die saw is used to cut the semiconductor dies 910 from the semiconductor wafer 102, such as by cutting along scribe lines on the semiconductor wafer 102. In one or more embodiments, a first semiconductor die 910 is separated from a second semiconductor die 910a (partially illustrated), such as by cutting along a first cut region 904, which may correspond to a first scribe line on the wafer 102. In one or more embodiments, the first semiconductor die 910 is separated from a third semiconductor die 910b (partially illustrated), such as by cutting along a second cut region 906, which may correspond to a second scribe line on the wafer 102. In one or more embodiments, a die attach film 902 is disposed on the backside(s) of one or more semiconductor dies. In one or more embodiments, the die attach film is applied to a backside of the wafer 102 before the semiconductor dies are separated from the wafer 102, such as to hold the dies in place during the separation process. In one or more embodiments, the die attach film 902 comprises one or more of resin, rubber, elastomer, epoxy, silicone, acrylic, adhesive, polyester, vinyl, carbon and/or the like.

Figure 11:
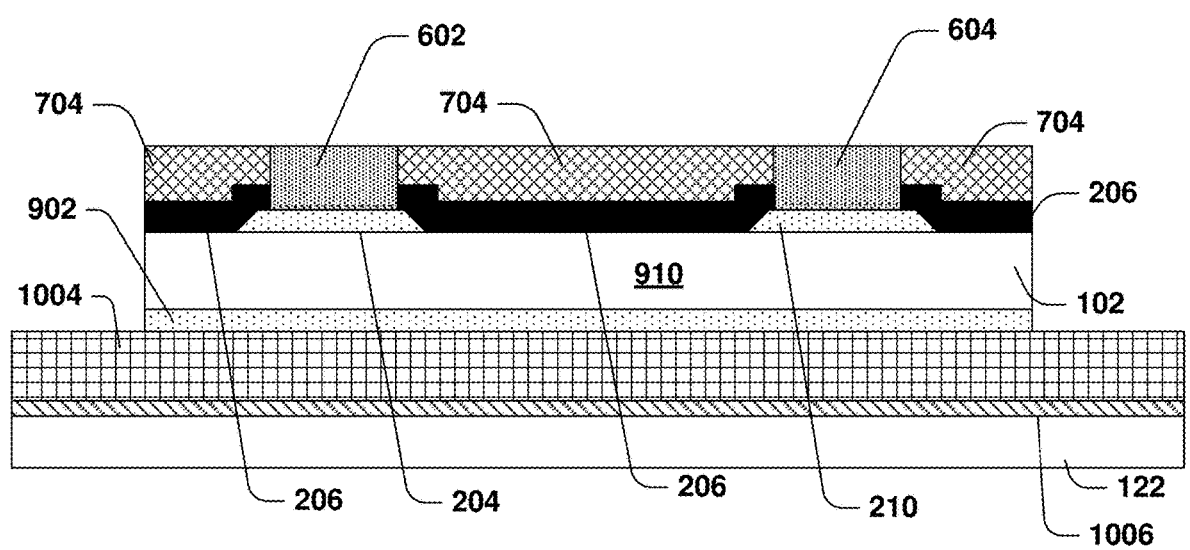
Figure 11:
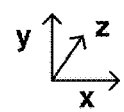

FIG. 11 illustrates a known good die 910 being placed on a carrier 122, according to one or more embodiments. Although a single die 910 is illustrated in FIG. 11, any number of known good dies may be placed on the carrier 122. Although not illustrated, additional space exists between known good dies on the carrier 122, as compared to an amount of space between dies before being cut from the wafer and transferred to the carrier 122, such as due to merely known good dies being transferred to the carrier 122. The additional space between dies allows more electrical connections to emanate or fan out from each die, thus affording fan out packaging. A backside protective insulator 1004 is attached to the die attach film 902, according to one or more embodiments. The backside protective insulator 1004 comprises a dielectric material, such as polymer, PBO, or other dielectric material, according to one or more embodiments. A light transfer heat conversion layer 1006 is formed between the backside protective insulator 1004 and the carrier 122, according to one or more embodiments. The light transfer heat conversion layer 1006 is used to adhere the backside protective insulator 1004 to the carrier 122, according to one or more embodiments. Exposure of the light transfer heat conversion layer 1006 to ultraviolet light allows the semiconductor arrangement to be removed from the carrier 122, such as by heating and softening the light transfer heat conversion layer 1006, according to one or more embodiments. The light transfer heat conversion layer 1006 comprises one or more thermoplastic resins, according to one or more embodiments.

Figure 12:
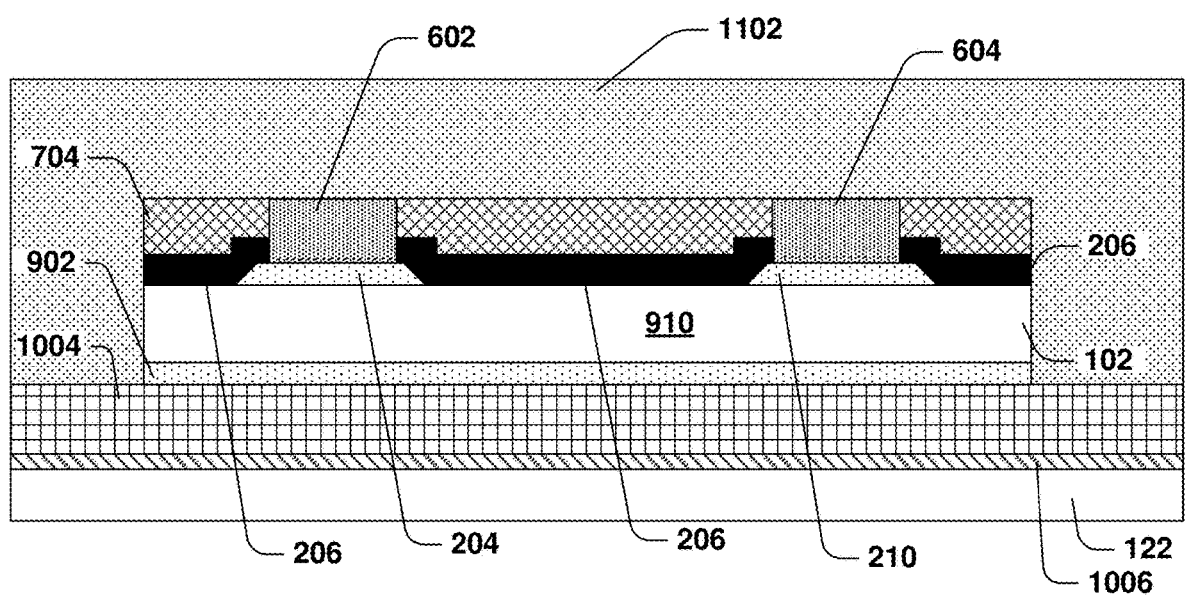
Figure 12:
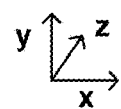

FIG. 12 illustrates a molding compound 1102 being applied over the backside protective insulator 1004, the first dielectric layer 704, the first via connector 602, and the second via connector 604, according to one or more embodiments. In one or more embodiments, the molding compound 1102 is applied by a dispensing or injection process as a liquid that is cured to a solid. In one or more embodiments, the molding compound 1102 is applied with an over thickness of about 40 µm to about 60 µm. The molding compound 1102 is formed adjacent to sides of the semiconductor die 910, such as adjacent to sides of the semiconductor wafer 102, according to one or more embodiments. The molding compound 1102 comprises a dielectric or resin, such as an epoxy resin filled with fine-granulate silica, according to one or more embodiments. The molding compound 1102 is formed as part of a fan out packaging process, according to one or more embodiments.

Figure 13:
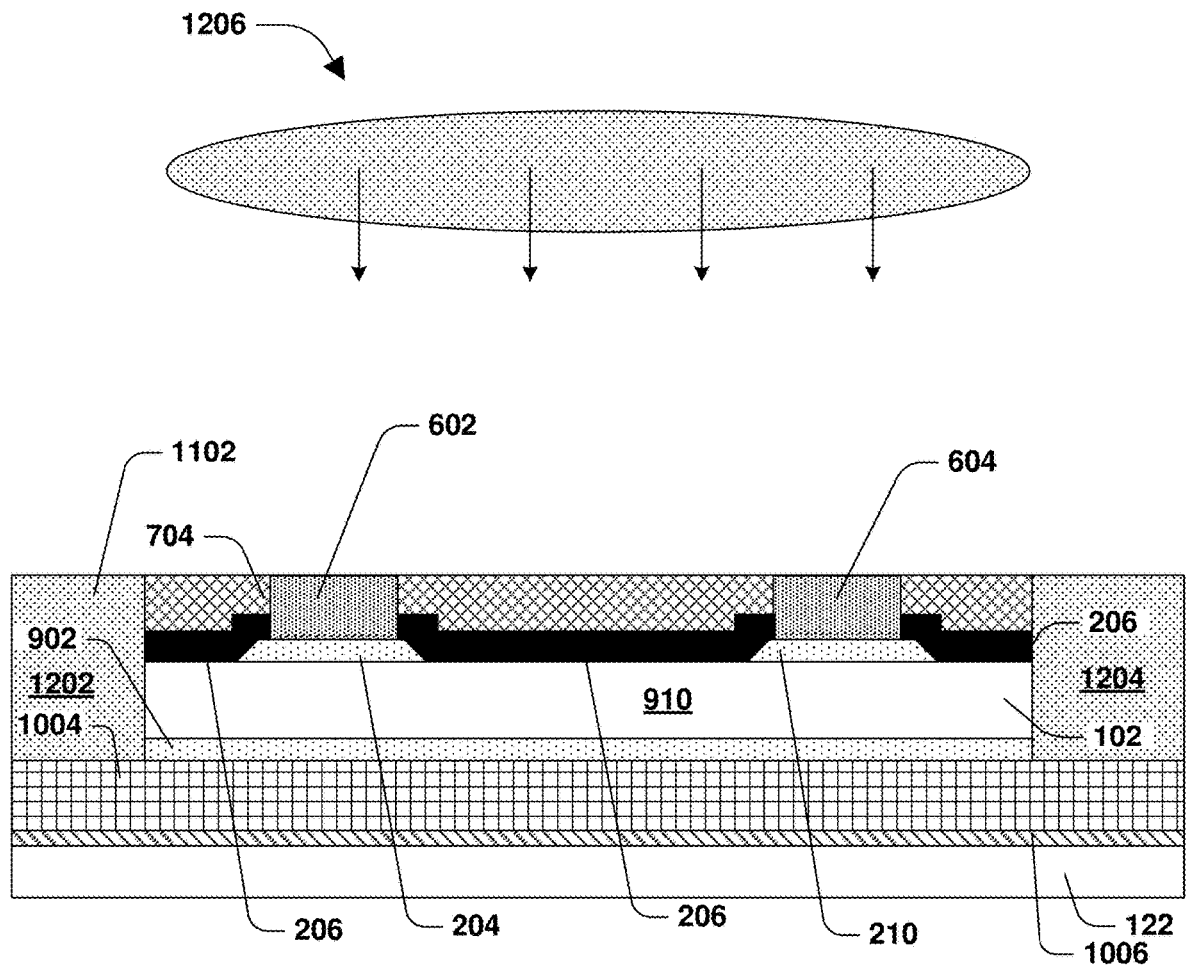
Figure 13:
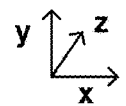

FIG. 13 illustrates a removal process 1206 to remove a portion of the molding compound 1102, according to one or more embodiments. In one or more embodiments, the removal process 1206 comprises at least one of a wafer grinding process or a chemical mechanical polishing (CMP) process to remove the portion of the molding compound 1102. The removal process 1206 exposes a top surface of the first via connector 602 and a top surface of the second via connector 604, according to one or more embodiments. The removal process 1206 exposes a top surface of the first dielectric layer 704, according to one or more embodiments. The removal process 1206 results in a first molding compound structure 1202 and a second molding compound structure 1204 comprised of remaining portions of the molding compound 1102 that are not removed by the removal process 1206, according to one or more embodiments.

Figure 14:
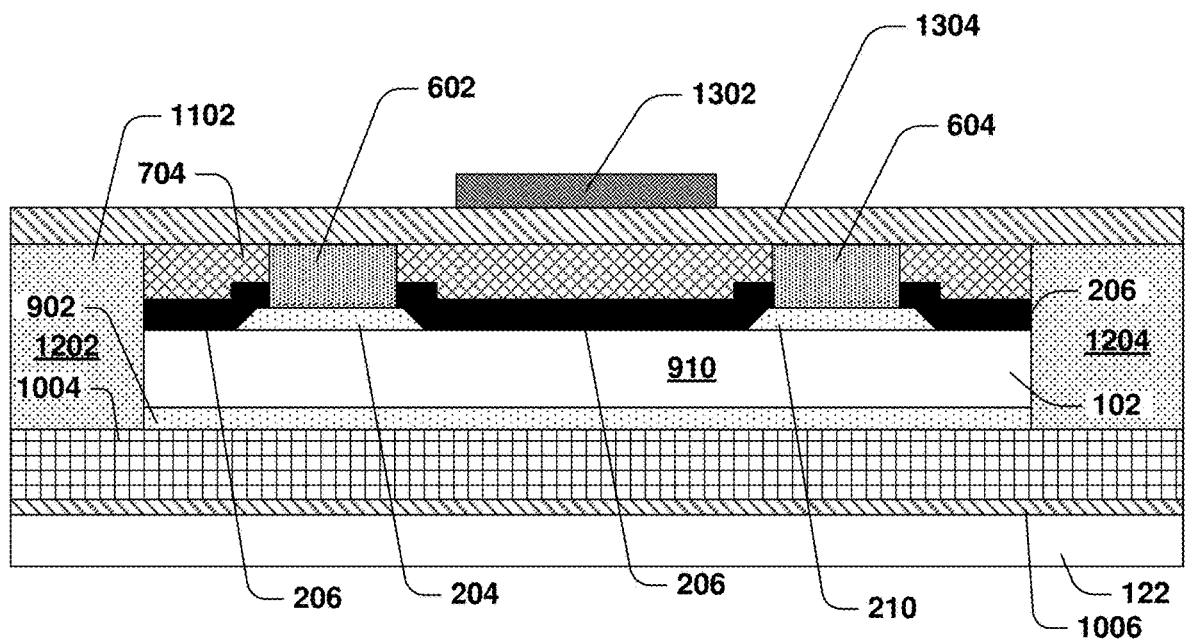

FIG. 14 illustrates a second dielectric layer 1304 formed over the first molding compound structure 1202, the second molding compound structure 1204, the first dielectric layer 704, the first via connector 602, and the second via connector 604, according to one or more embodiments. In one or more embodiments, the second dielectric layer 1304 has a thickness of about 5 µm to about 25 µm. The second dielectric layer 1304 comprises a polymer, such as a PBO polymer, according to one or more embodiments.

The bottom magnetic portion 1302 of the magnetic structure 1904, illustrated in FIG. 1, is formed over the second dielectric layer 1304, according to one or more embodiments. The bottom magnetic portion 1302 has a thickness of about 5 µm to about 40 µm, according to one or more embodiments. Various formation processes, such as deposition and patterning, may be performed to form the bottom magnetic portion 1302, according to one or more embodiments. In one or more embodiments, a spin coating process is performed using at least one of a nickel (Ni) material, a zinc (Zn) material, or a cooper iron oxide (Cu—Fe2O4) material to form the bottom magnetic portion 1302. In one or more embodiments, the spin coating process deposits a material corresponding to about 30% to about 50% Zi, about 30% to about 50% Zn, and about 15% to about 25% Cu—Fe2O4.

In one or more embodiments, a spin coating process is performed using at least one of a yttrium (Y) material or a bismuth iron oxide (Bi—Fe5O12) material to form the bottom magnetic portion 1302. In one or more embodiments, the spin coating process deposits a material corresponding to about 70% to about 90% Y and about 15% to about 25% Bi—Fe5O12.

In one or more embodiments, an electroplating deposition process is performed using at least one of a nickel (Ni) material or an iron (Fe) material to form the bottom magnetic portion 1302. In one or more embodiments, the electroplating deposition process deposits a material corresponding to about 70% to about 90% Ni and about 15% to about 25% Fe. In one or more embodiments, the material has a relatively low hysteresis and a relatively high permeability.

In one or more embodiments, a sputtering process is performed using at least one of a nickel (Ni) material or an iron (Fe) material to form the bottom magnetic portion 1302. In one or more embodiments, the sputtering process deposits a material corresponding to about 70% to about 90% Ni and about 15% to about 25% Fe.

In one or more embodiments, a sputtering process is performed using at least one of a cobalt (Co) material, a tantalum (Ta) material, or a zirconium (Zr) material to form the bottom magnetic portion 1302. In one or more embodiments, the sputtering process deposits a material corresponding to about 90% to about 93% Co, about 4% to about 5% Ta, and about 3% to about 5% Zr.

Figure 15:
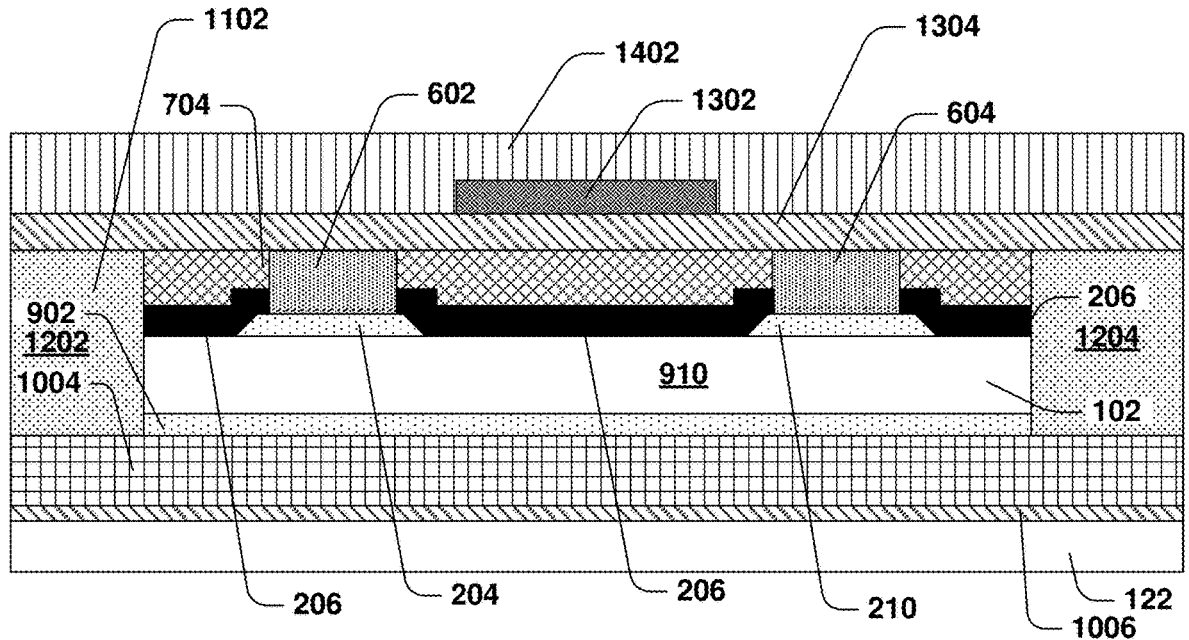
Figure 15:
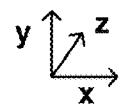

FIG. 15 illustrates a third dielectric layer 1402 formed over the bottom magnetic portion 1302 and the second dielectric layer 1304. In one or more embodiments, the third dielectric layer 1402 is formed by a spin coat process. The third dielectric layer 1402 comprises a polymer, such as a PBO polymer, according to one or more embodiments.

Figure 16:
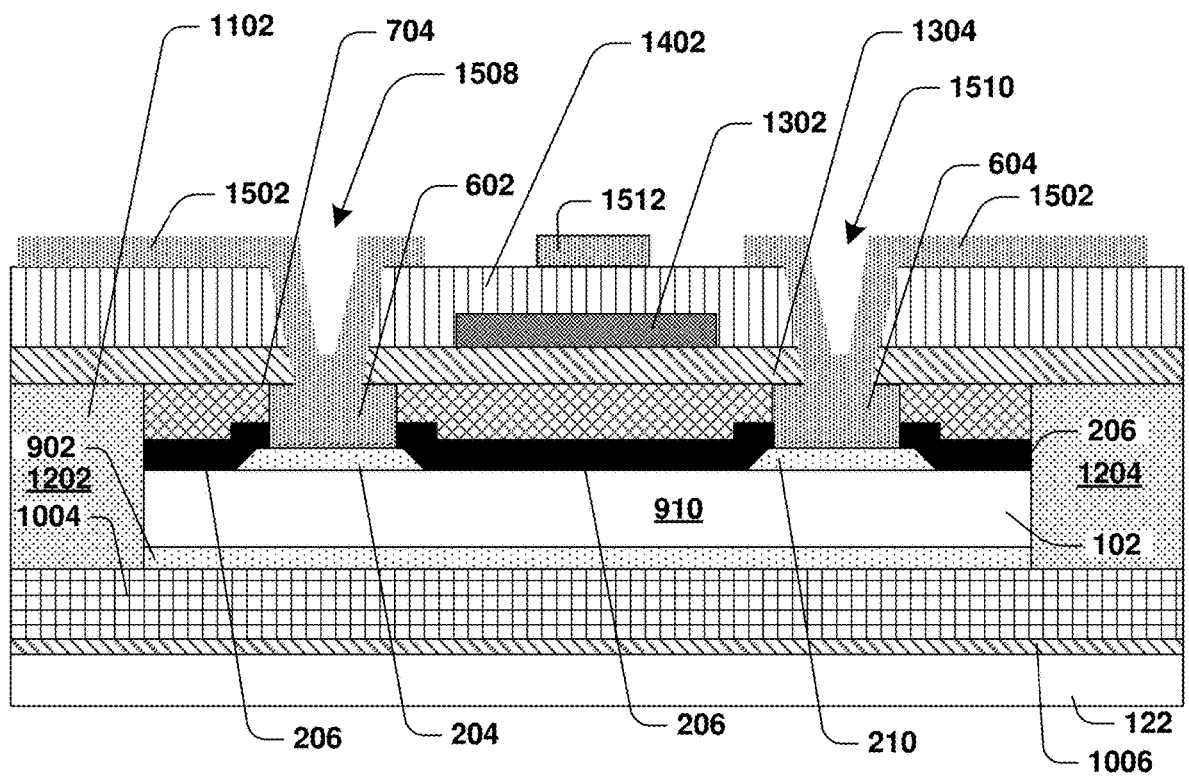

FIG. 16 illustrates formation of a first redistribution (RDL) layer 1502 and the transmission line 1512, according to one or more embodiments. At least one of the first redistribution layer 1502 or the transmission line 1512 comprises a conductive material such as at least one of copper, gold, aluminum, nickel, silver, tin, or titanium/tungsten (Ti/W) seeded electroplated copper, according to one or more embodiments. In one or more embodiments, a first opening 1508 and a second opening 1510 are formed through the third dielectric layer 1402 and the second dielectric layer 1304, such as by patterning and etching, so that the first opening 1508 exposes a top surface of the first via connector 602 and the second opening 1510 exposes a top surface of the second via connector 604.

In one or more embodiments, at least one of the first opening 1508 or the second opening 1510 has a tapered shape, such as tapered sidewalls. A distance between sidewalls defining the first opening 1508 distal from the top surface of the first via connector 602 is greater than a distance between sidewalls defining the first opening 1508 proximal to the top surface of the first via connector 602, according to one or more embodiments. A distance between sidewalls defining the second opening 1510 distal from the top surface of the second via connector 604 is greater than a distance between sidewalls defining the second opening 1510 proximal to the top surface of the second via connector 604, according to one or more embodiments.

In one or more embodiments, the first redistribution layer 1502 is conformally formed over the third dielectric layer 1402 and within the first opening 1508 and the second opening 1510 to contact the top surface of the first via connector 602 and the top surface of the second via connector 604. The first redistribution layer 1502 is patterned to reveal a portion of the third dielectric layer 1402 where the magnetic structure 1904, illustrated in FIG. 1, will be formed, according to one or more embodiments.

In one or more embodiments, the first redistribution layer 1502 has a thickness of about 4 μm to about 8 μm. In one or more embodiments, a layer of conductive material is formed and patterned to establish the transmission line 1512. In one or more embodiments, a mask or resist is patterned to have an opening and a conductive material is formed in the opening to establish the transmission line 1512, and the patterned mask or resist is removed after the transmission line 1512 is formed.

Figure 17:
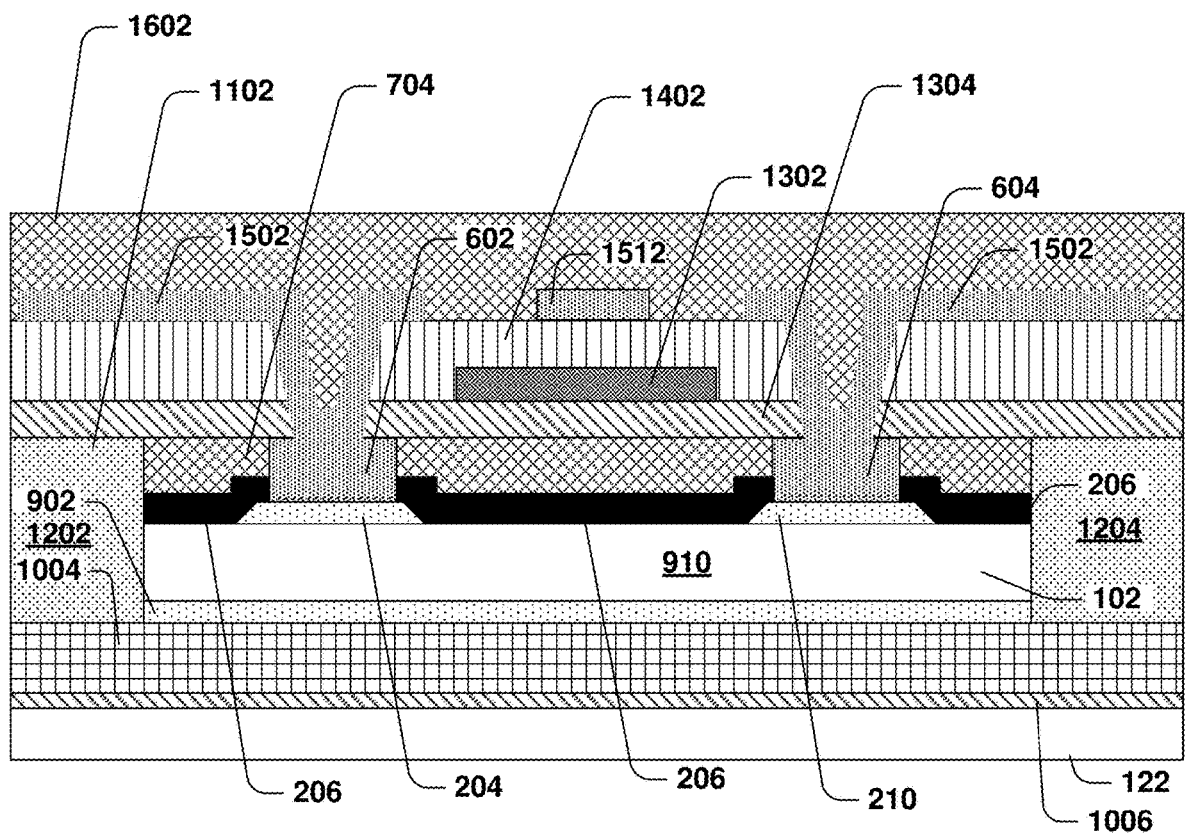

FIG. 17 illustrates a fourth dielectric layer 1602 formed over the first redistribution layer 1502, over the third dielectric layer 1402, and over the transmission line 1512, according to one or more embodiments. In one or more embodiments, the fourth dielectric layer 1602 is formed by a spin coat process. The fourth dielectric layer 1602 comprises a polymer, such as a PBO polymer, according to one or more embodiments.

Figure 18:
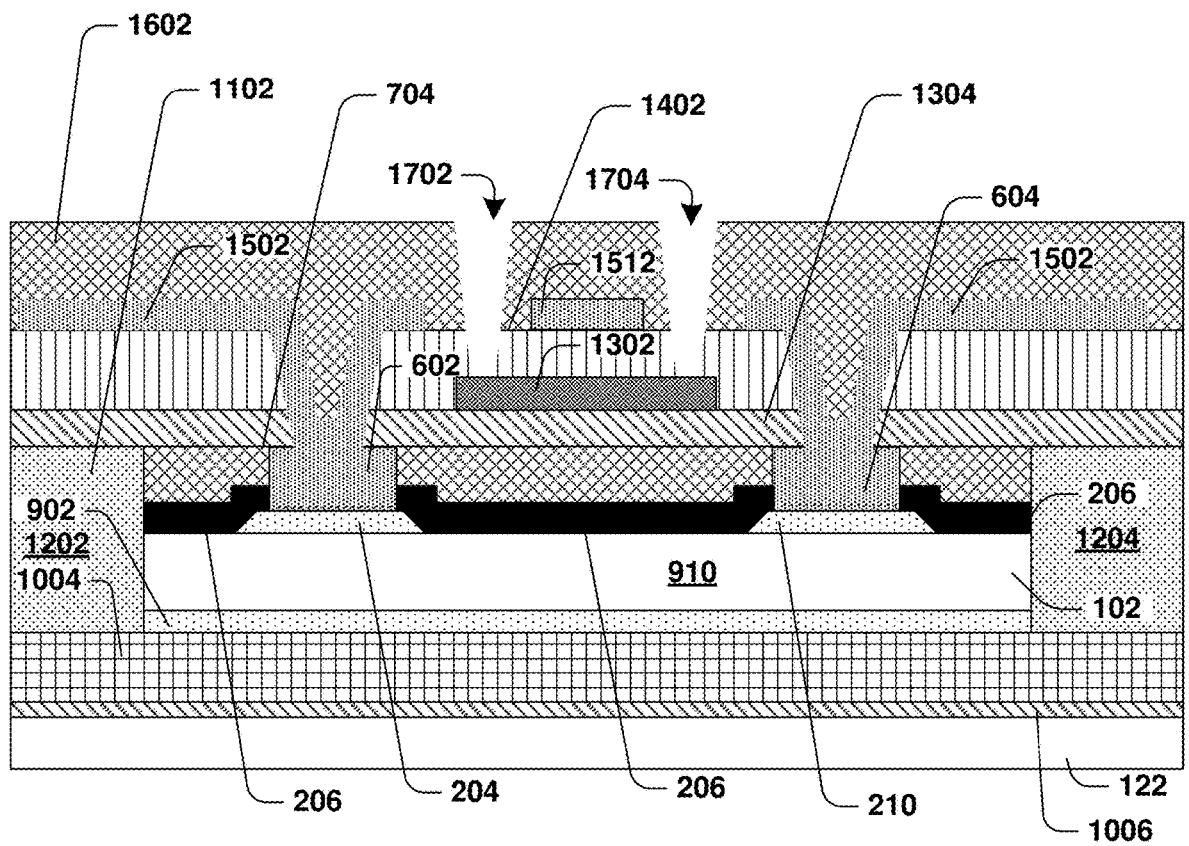

FIG. 18 illustrates a first opening 1702 and a second opening 1704 formed through the fourth dielectric layer 1602 and the third dielectric layer 1402 so that a top surface of the bottom magnetic portion 1302 is exposed through the first opening 1702 and the second opening 1704, according to one or more embodiments. In one or more embodiments, at least one of the first opening 1702 or the second opening 1704 has a tapered shape, such as tapered sidewalls. A distance between sidewalls defining the first opening 1702 distal from the bottom magnetic portion 1302 is greater than a distance between sidewalls defining the first opening 1702 proximal to the bottom magnetic portion 1302, according to one or more embodiments. A distance between sidewalls defining the second opening 1704 distal from the bottom magnetic portion 1302 is greater than a distance between sidewalls defining the second opening 1704 proximal to the bottom magnetic portion 1302, according to one or more embodiments.

Figure 19:
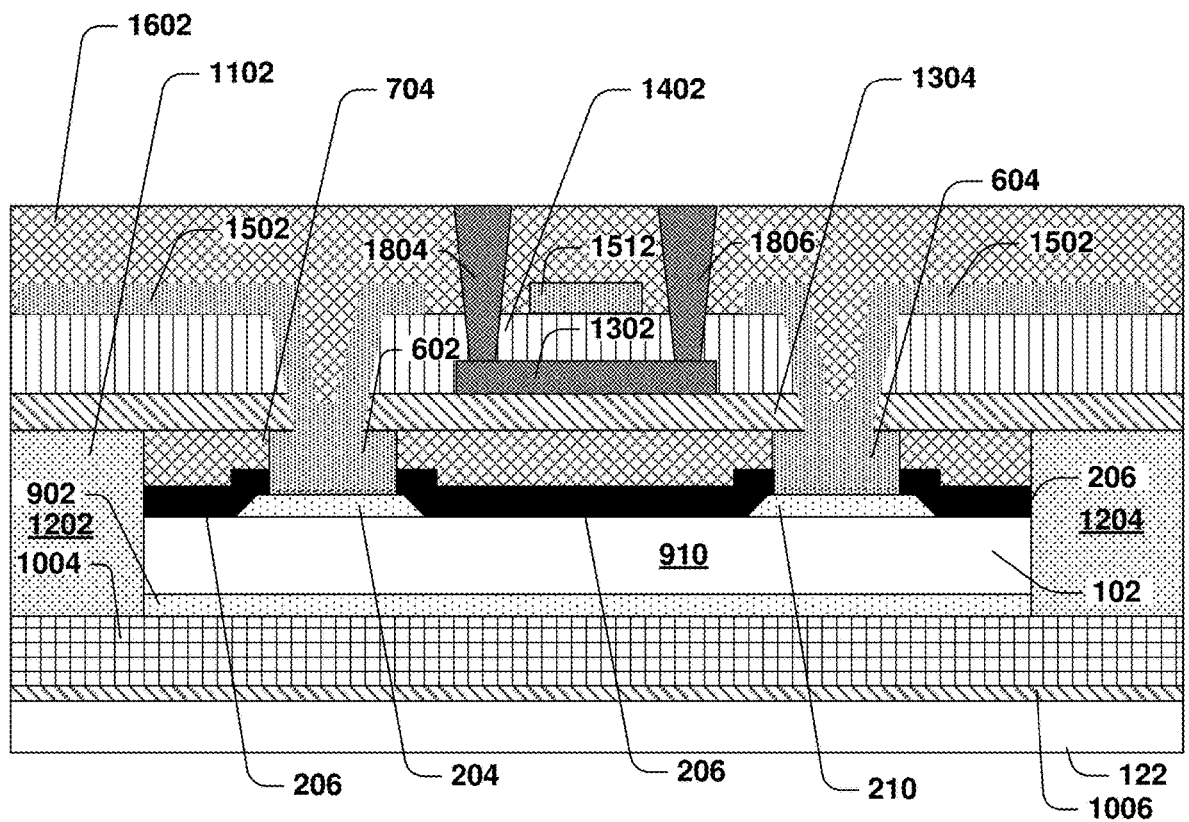
Figure 19:
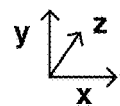

FIG. 19 illustrates a magnetic material formed within the first opening 1702 and the second opening 1704 to form the first side magnetic portion 1804 and the second side magnetic portion 1806 of the magnetic structure 1904, illustrated in FIG. 1, according to one or more embodiments. In one or more embodiments, at least one of the first side magnetic portion 1804 or the second side magnetic portion 1806 has a tapered sidewall. A first top portion of the first side magnetic portion 1804 distal from the bottom magnetic portion 1302 is wider than a first bottom portion of the first side magnetic portion 1804 proximal to the bottom magnetic portion 1302, according to one or more embodiments. A second top portion of the second side magnetic portion 1806 distal from the bottom magnetic portion 1302 is wider than a second bottom portion of the second side magnetic portion 1806 proximal to the bottom magnetic portion 1302, according to one or more embodiments.

The first side magnetic portion 1804 is formed opposite the second side magnetic portion 1806 relative to the transmission line 1512, according to one or more embodiments. The first side magnetic portion 1804 and the second side magnetic portion 1806 are coupled to the bottom magnetic portion 1302, according to one or more embodiments. In one or more embodiments, a height of at least one of the first side magnetic portion 1804 or the second side magnetic portion 1806 is about 10 μm to about 2,000 μm. Various formation processes may be performed to form the first side magnetic portion 1804 and the second side magnetic portion 1806. In one or more embodiments, at least one of the first side magnetic portion 1804 or the second side magnetic portion 1806 may be formed by at least one of the foregoing techniques described for forming the bottom magnetic portion 1302. In one or more embodiments, at least one of the first side magnetic portion 1804 or the second side magnetic portion 1806 may be formed using at least one of the foregoing materials described for forming the bottom magnetic portion 1302.

Figure 20:
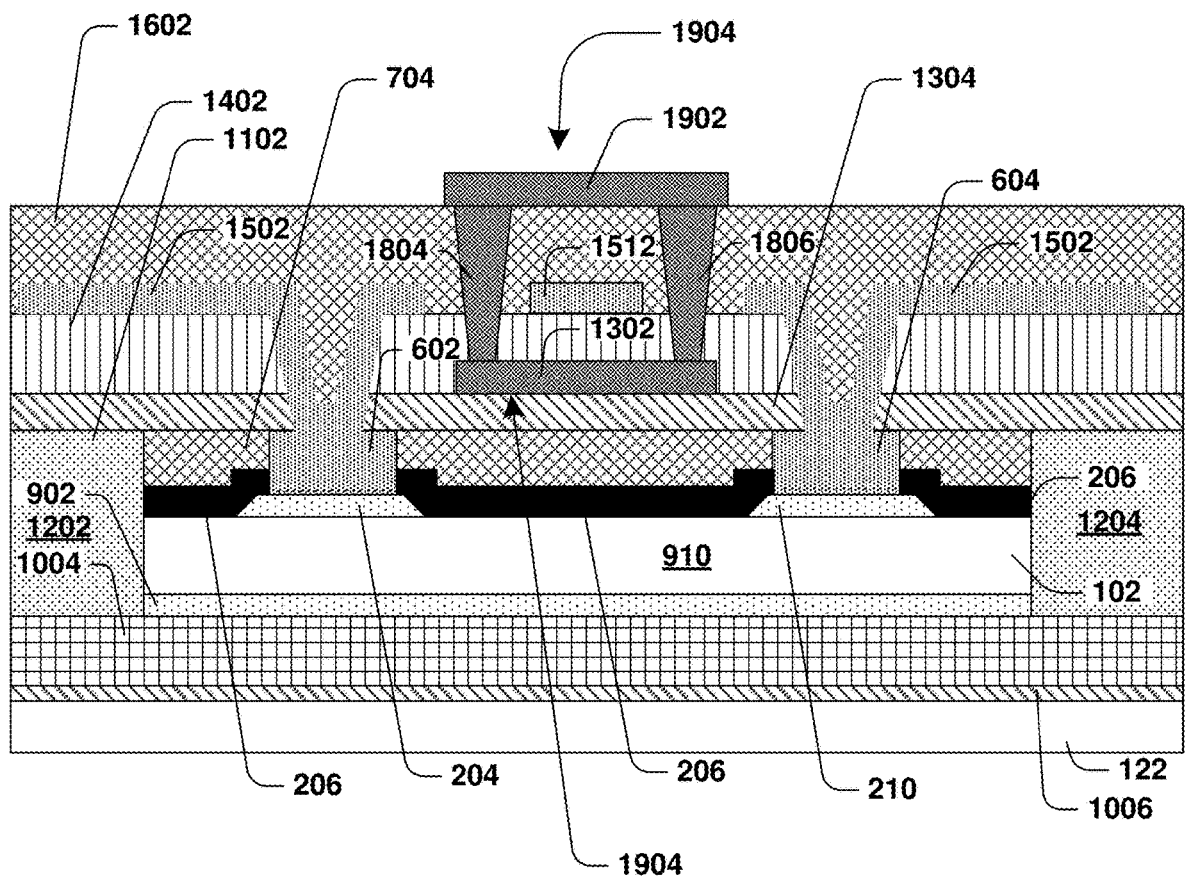

FIG. 20 illustrates the top magnetic portion 1902, of the magnetic structure 1904 illustrated in FIG. 1, formed over the fourth dielectric layer 1602, the first side magnetic portion 1804, and the second side magnetic portion 1806, according to one or more embodiments. The top magnetic portion 1902 has a thickness of about 5 µm to about 40 µm, according to one or more embodiments. Various formation processes may be performed to form the top magnetic portion 1902. In one or more embodiments, the top magnetic portion 1902 may be formed by at least one of the foregoing techniques described for forming the bottom magnetic portion 1302. In one or more embodiments, the top magnetic portion 1902 may be formed using at least one of the foregoing materials described for forming the bottom magnetic portion 1302.

The magnetic structure 1904 increases the characteristic impedance, such as an imaginary portion of impedance, of the transmission line 1512, according to one or more embodiments. Increasing the characteristic impedance provides for power reduction because less current is needed, such as by a current amplifier or current meter, electrically coupled to the transmission line 1512.

Figure 21:
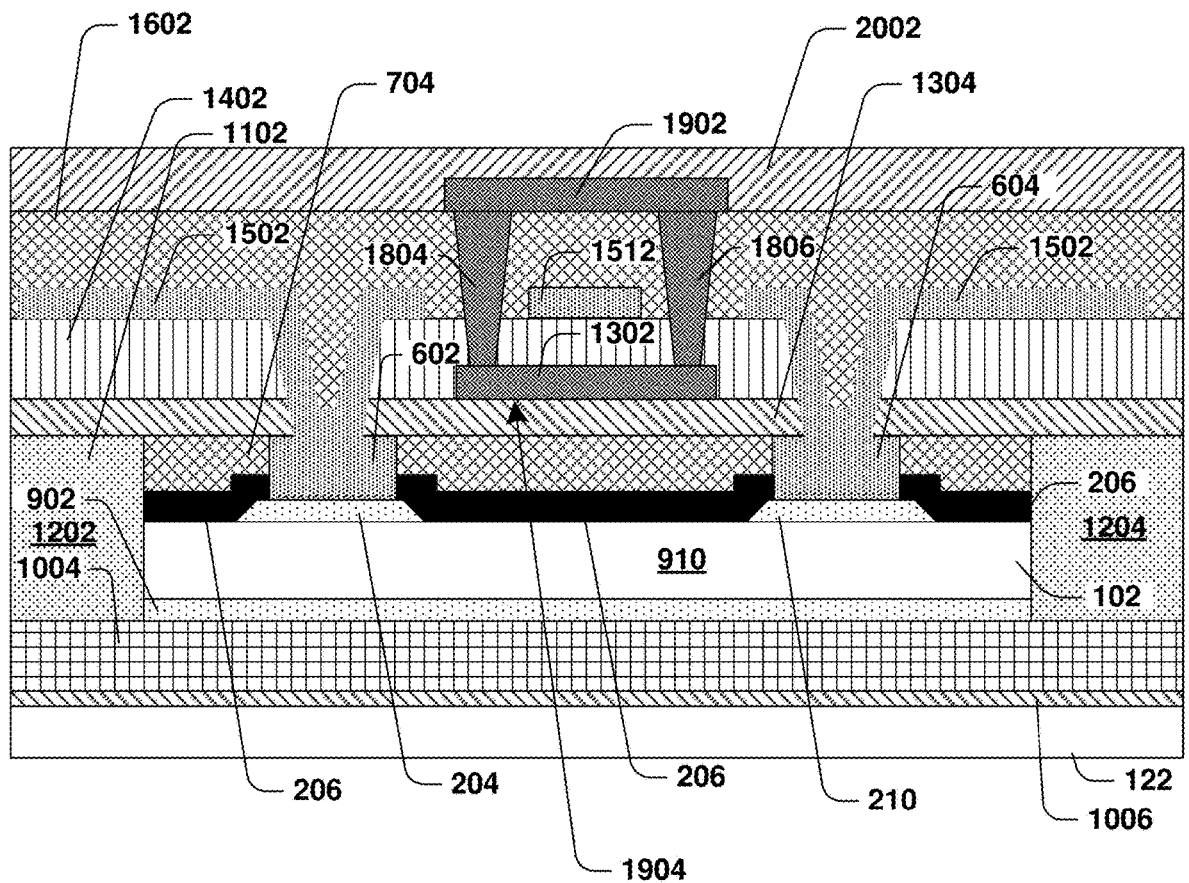

FIG. 21 illustrates a fifth dielectric layer 2002 formed over the fourth dielectric layer 1602 and the top magnetic portion 1902 of the magnetic structure 1904, according to one or more embodiments. The fifth dielectric layer 2002 comprises a polymer, such as a PBO polymer, according to one or more embodiments.

Figure 22:
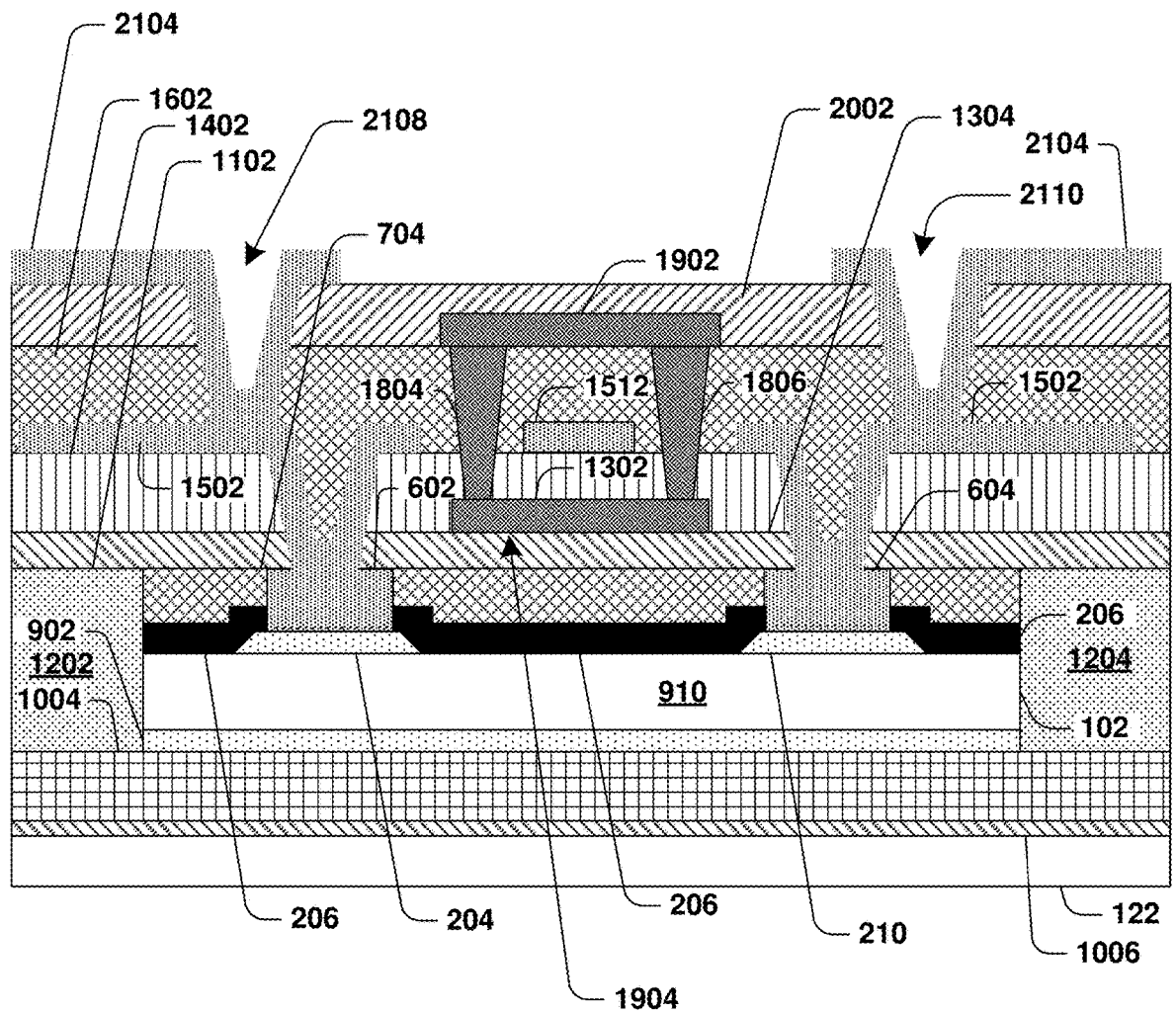
Figure 22:
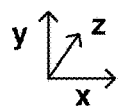

FIG. 22 illustrates formation of a second redistribution layer 2104, according to one or more embodiments. The second redistribution layer 2104 comprises a conductive material such as at least one of copper, gold, aluminum, silver, tin, or nickel, according to one or more embodiments. In one or more embodiments, a first opening 2108 and a second opening 2110 are formed through the fifth dielectric layer 2002 and the fourth dielectric layer 1602, such as by patterning and etching, so that the first opening 2108 and the second opening 2110 expose a top surface of the first redistribution layer 1502.

In one or more embodiments, at least one of the first opening 2108 or the second opening 2110 has a tapered shape, such as tapered sidewalls. A distance between sidewalls defining the first opening 2108 distal from the top surface of the first redistribution layer 1502 is greater than a distance between sidewalls defining the first opening 2108 proximal to the top surface of the first redistribution layer 1502, according to one or more embodiments. A distance between sidewalls defining the second opening 2110 distal from the top surface of the first redistribution layer 1502 is greater than a distance between sidewalls defining the second opening 1510 proximal to the first redistribution layer 1502, according to one or more embodiments In one or more embodiments, the second redistribution layer 2104 is conformally formed over the fifth dielectric layer 2002 and within the first opening 2008 and the second opening 2110 to contact the top surface of the first redistribution layer 1502. The second redistribution layer 2104 is patterned to reveal a portion of the fifth dielectric layer 2002 over the magnetic structure 1904, according to one or more embodiments. In one or more embodiments, the second redistribution layer 2104 has a thickness of about 4 µm to about 20 µm.

Figure 23:
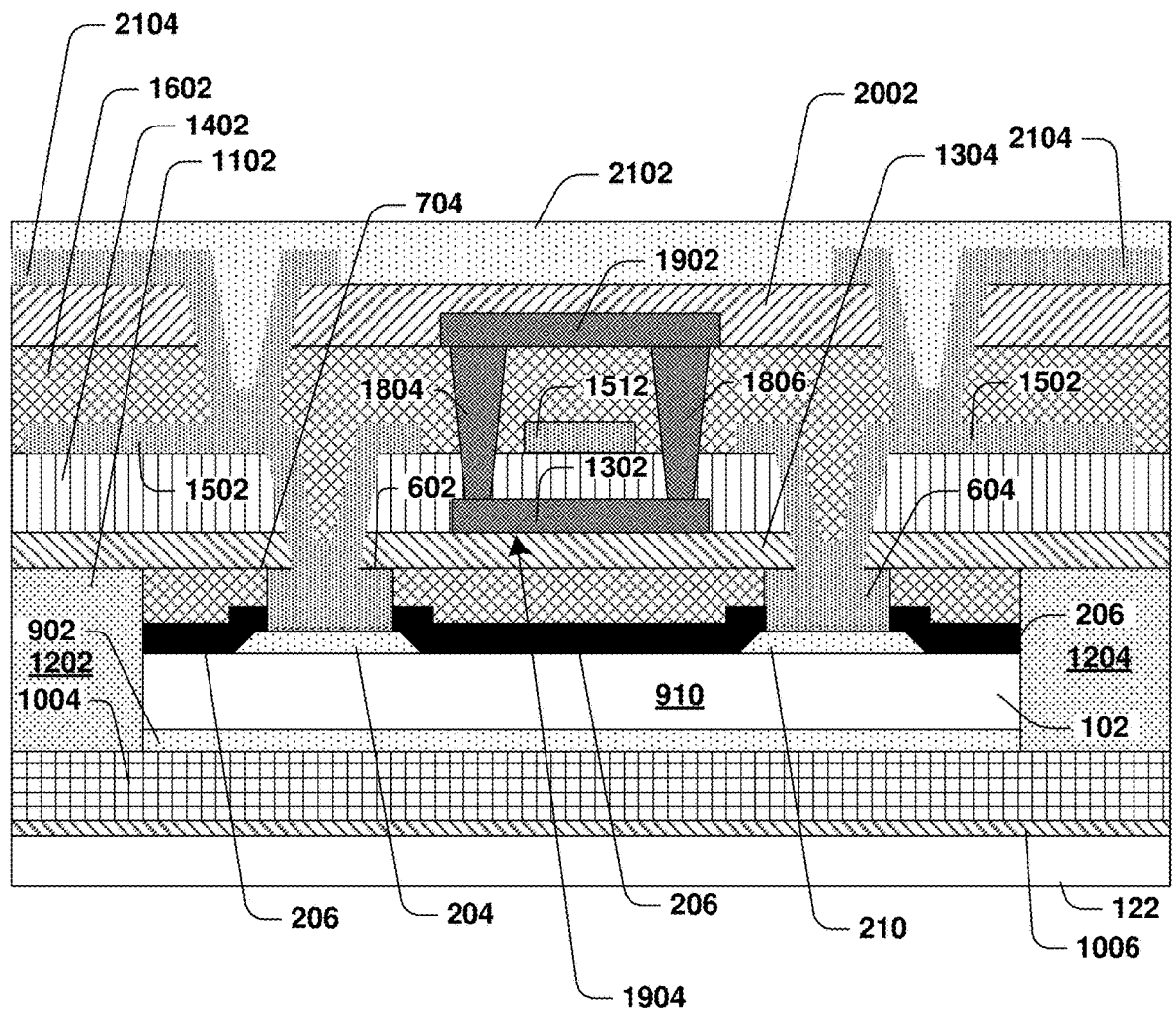

FIG. 23 illustrates a sixth dielectric layer 2102 formed over the second redistribution layer 2104 and over the fifth dielectric layer 2002, according to one or more embodiments. In one or more embodiments, the sixth dielectric layer 2102 is formed by a spin coat process. The sixth dielectric layer 2102 comprises a polymer, such as a PBO polymer, according to one or more embodiments.

Figure 24:
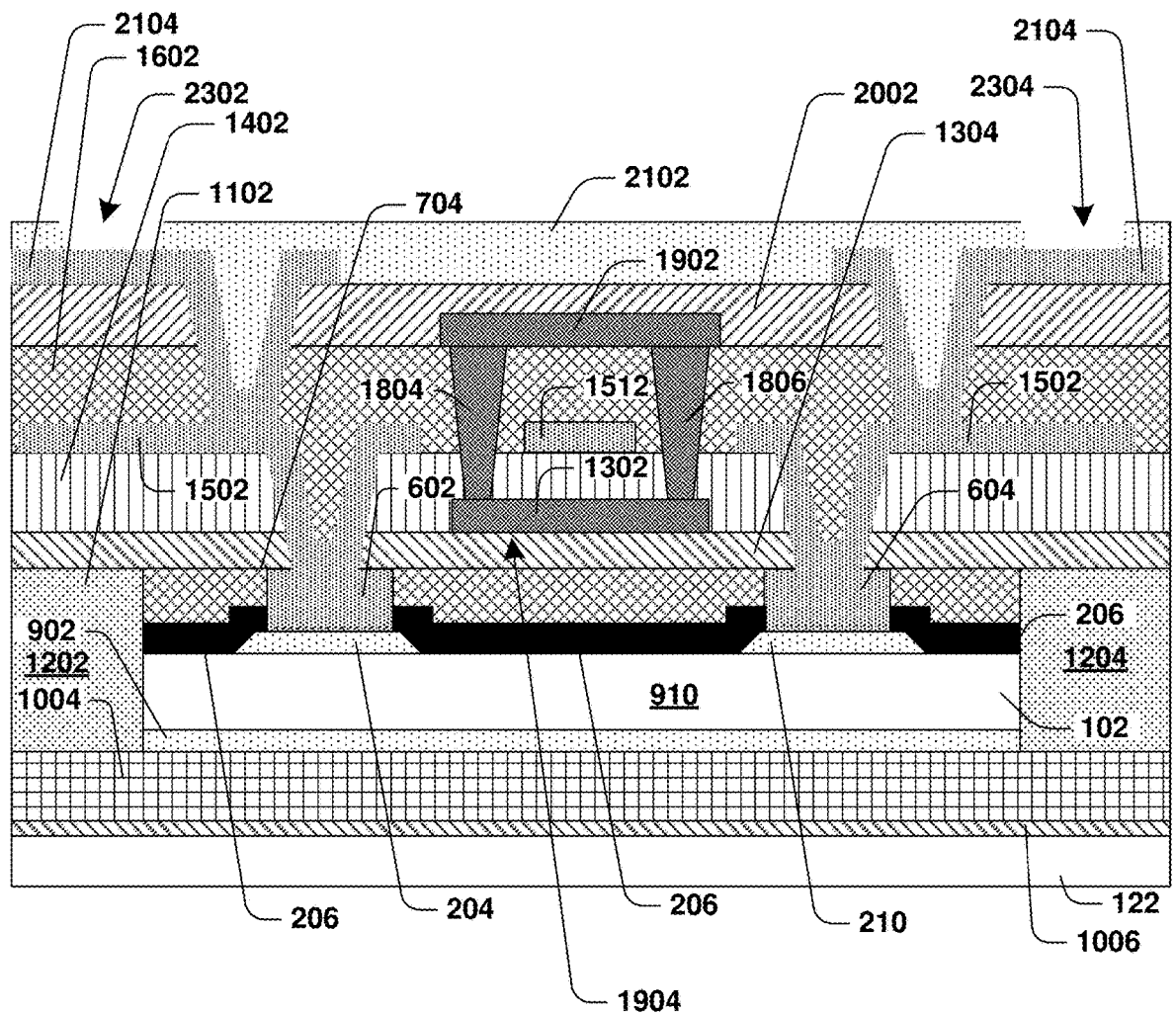
Figure 25:
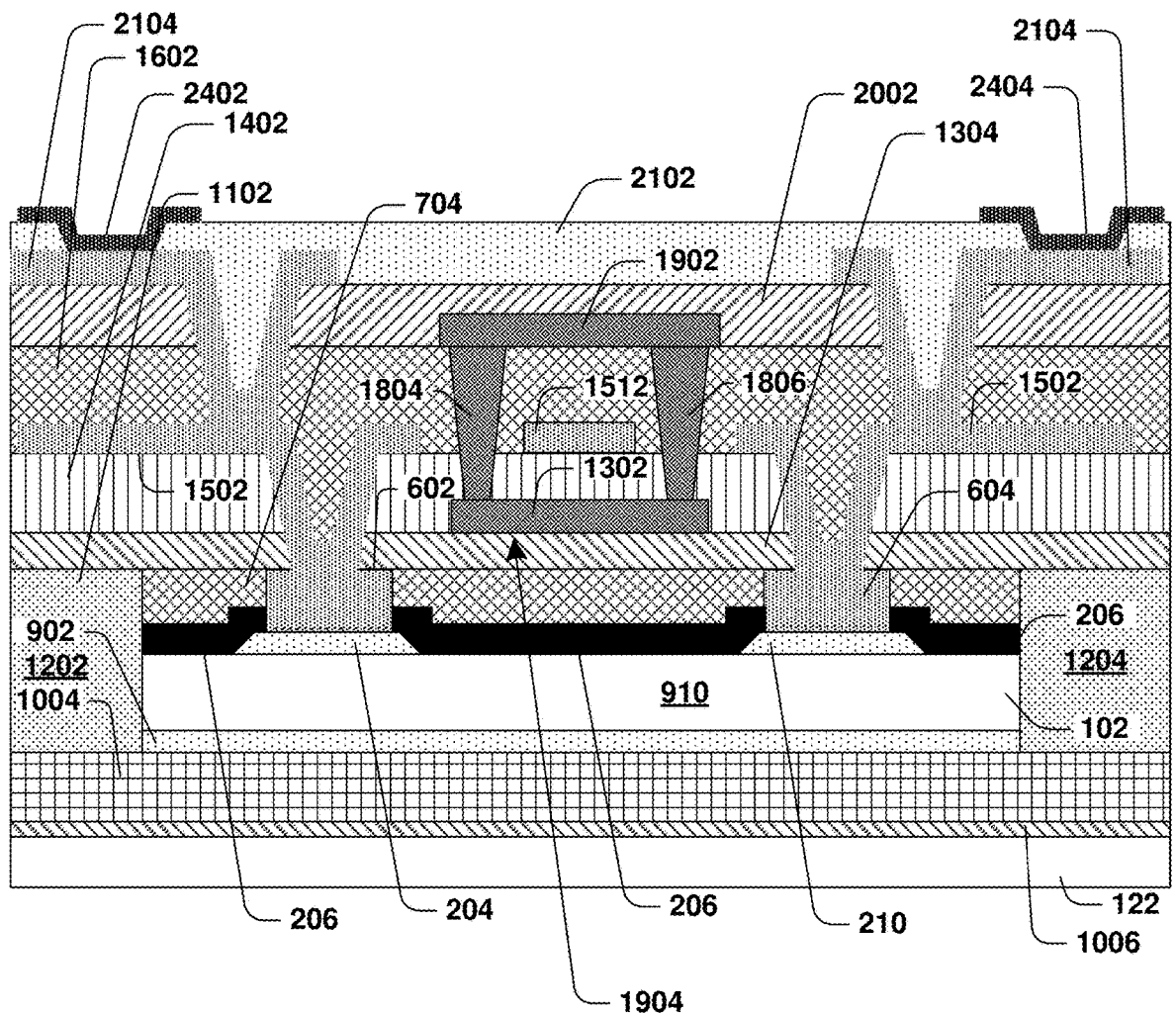
Figure 26:
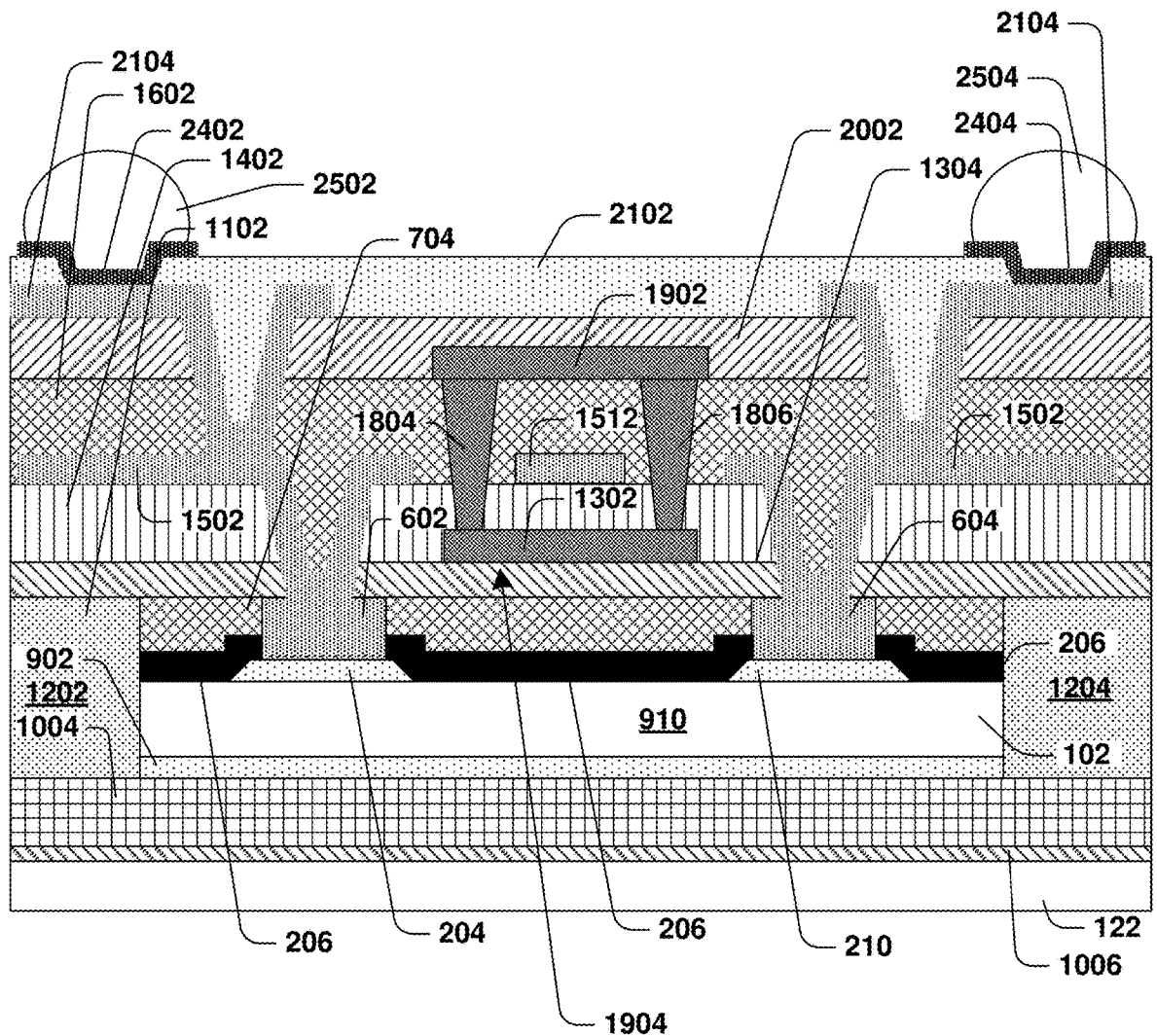

FIG. 24 illustrates formation of a first top opening 2302 and a second top opening 2304 through the sixth dielectric layer 2102, such as by patterning and etching, according to one or more embodiments. FIG. 25 illustrates formation of a first under bump metallurgy (UBM) 2402 within the first top opening 2302 and a second under bump metallurgy 2404 within the second top opening 2304, according to one or more embodiments. The first under bump metallurgy 2402 and the second under bump metallurgy 2404 are formed from conductive material, according to one or more embodiments. A conformal layer of conductive material may be formed over the sixth dielectric layer 2102 and within the first top opening 2302 and the second top opening 2304 and patterned to establish the first under bump metallurgy 2402 and the second under bump metallurgy 2404, according to one or more embodiments. At least one of the first under bump metallurgy 2402 or the second under bump metallurgy 2404 may have a thickness of about 2 µm to about 20 µm, according to one or more embodiments. At least one of the first under bump metallurgy 2402 or the second under bump metallurgy 2404 may have a width of about 300 µm to about 400 µm, according to one or more embodiments FIG. 26 illustrates formation of a first solder ball 2502 over the first under bump metallurgy 2402 and a second solder ball 2504 over the second under bump metallurgy 2404, according to one or more embodiments. In one or more embodiments, the first solder ball 2502 and the second solder ball 2504 comprise a conductive material, such as at least one of lead, bismuth, copper, gold, aluminum, nickel, tin, or silver. In one or more embodiments, the first solder ball 2502 and the second solder ball 2504 have a diameter of about 300 µm to about 400 µm.

According to one or more embodiments, the first solder ball 2502 provides electrical coupling to the semiconductor die 910 by way of the first under bump metallurgy 2402, the second redistribution layer 2104, the first redistribution layer 1502, the first via connector 602, and the first conductive pad 204. According to one or more embodiments, the second solder ball 2504 provides electrical coupling to the semiconductor die 910 by way of the second under bump metallurgy 2404, the second redistribution layer 2104, the first redistribution layer 1502, the second via connector 604, and the second conductive pad 210.

Figure 27:
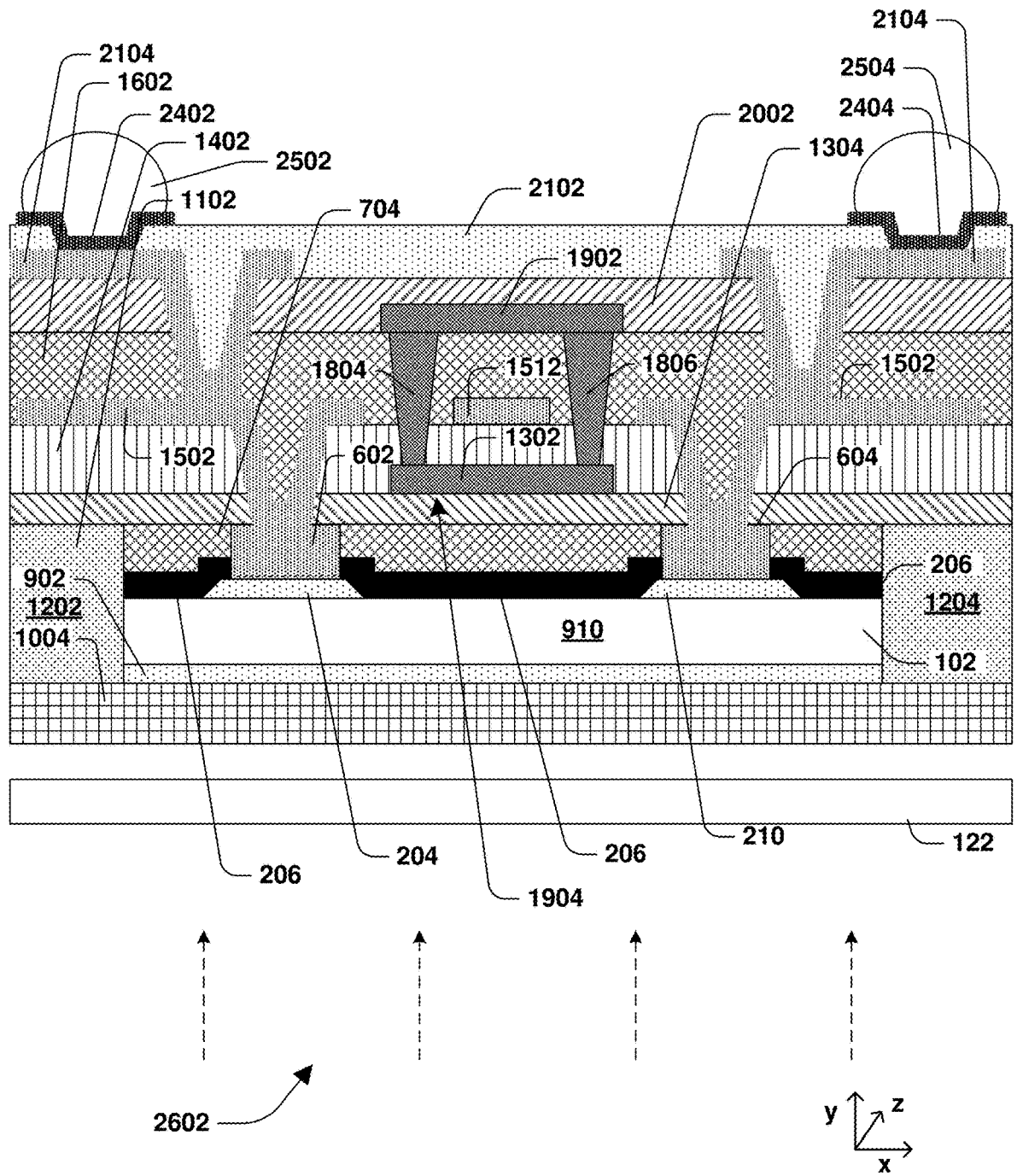

FIG. 27 illustrates the semiconductor arrangement being removed from the carrier 122, according to one or more embodiments. In one or more embodiments, an ultraviolet light 2602 is applied through the carrier 122 to the light transfer heat conversion layer 1006. Heat from the ultraviolet light 2602 breaks down the light transfer heat conversion layer 1006 so that the semiconductor arrangement may be removed from the carrier 122, according to one or more embodiments.

Figure 28:
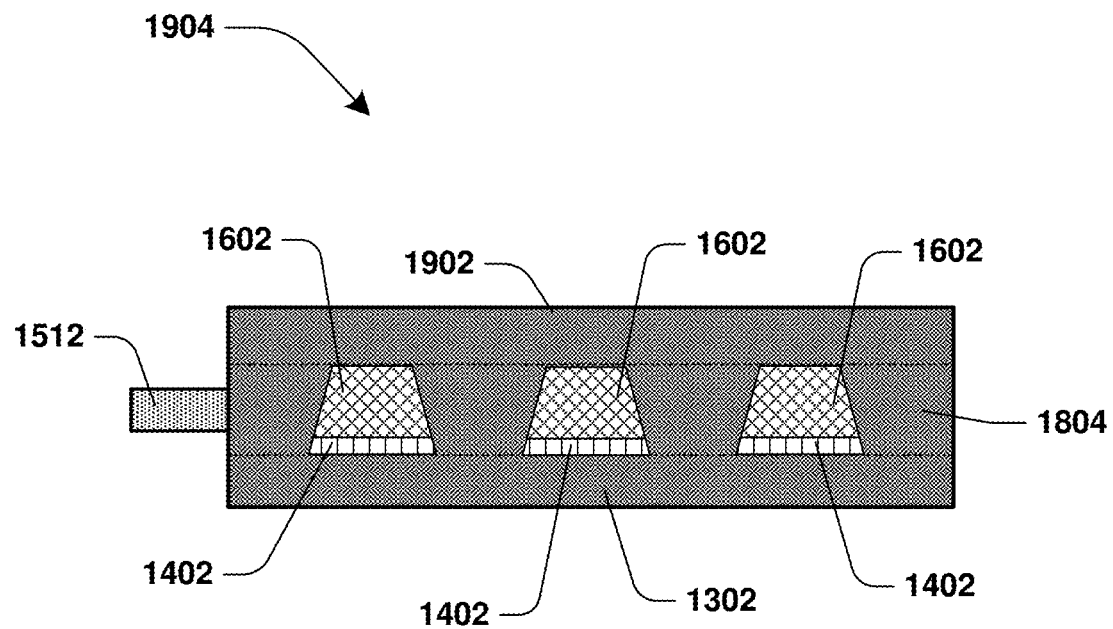
FIG. 28 is an illustration of a side view of a semiconductor arrangement, in accordance with one or more embodiments.

FIG. 28 illustrates a cross sectional view of the magnetic structure 1904. The cross sectional view illustrated in FIG. 28 is rotated 90 degrees relative to the cross sectional views illustrated in FIGS. 3-27. The cross sectional view illustrated in FIG. 28 depicts a cut through the first side magnetic portion 1804 in the y, z plane. Accordingly, FIG. 28 illustrates a side of the first side magnetic portion 1804 in the y, z plane. FIG. 28 illustrates that the first side magnetic portion 1804 need not be solid, in accordance with one or more embodiments. Instead, portions of one or more dielectric layers, such as 1402, 1602, may exist between segments of the first side magnetic portion 1804. To form such a segmented first side magnetic portion 1804, the first opening 1702, illustrated in FIG. 18, would not continually extend in the z direction. Multiple sub openings would instead be formed in the one or more dielectric layers, and then filled as described with respect to FIG. 19 to establish the segmented first side magnetic portion 1804. Segments of the first side magnetic portion 1804 are not limited to what is depicted in FIG. 28, but may be any size, shape, number, etc. The second side magnetic portion 1806 may also have a segmented arrangement, according to one or more embodiments. One or more segments of at least one of the first side magnetic portion 1804 or the second side magnetic portion 1806 are coupled to the top magnetic portion 1902 and the bottom magnetic portion 1302, according to one or more embodiments.

Figure 29:
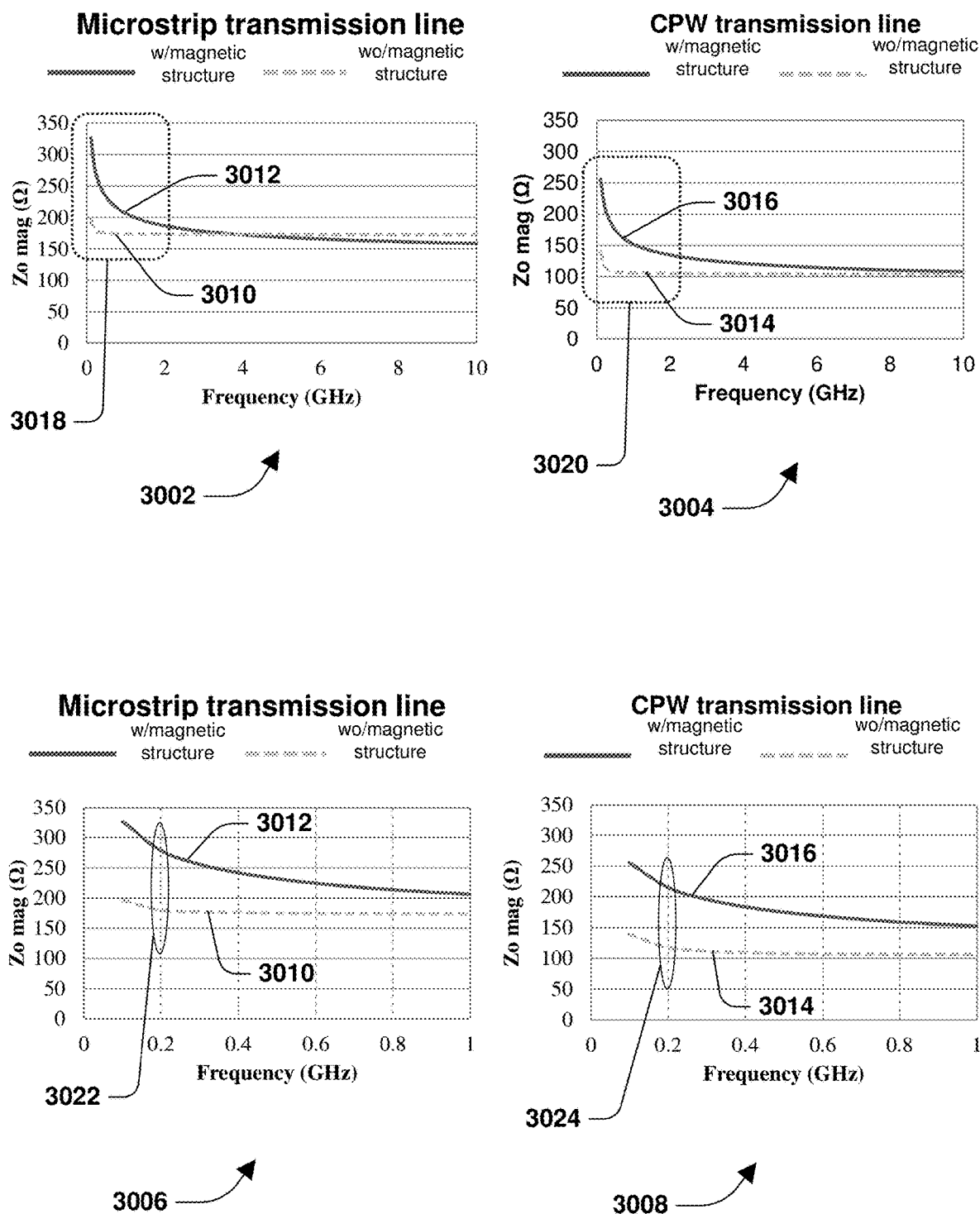
FIG. 29 is an illustration of a first graph, a second graph, a third graph, and a fourth graph illustrating impedances of a transmission line, in accordance with one or more embodiments.

FIG. 29 illustrates a first graph 3002, a second graph 3004, a third graph 3006, and a fourth graph 3008 that plot impendence values of the transmission line 1512, such as a copper transmission line, along y-axes for different frequencies along x-axes. Solid plot lines represent impedance while using the magnetic structure 1904 and dashed plot lines represent impedance without using the magnetic structure 1904. The first graph 3002 has a first plot 3010 of impedance values for a microstrip transmission line, such as a copper transmission line, version of the transmission line 1512 when the magnetic structure 1904 is not used. The first graph 3002 has a second plot 3012 of impedance values for the microstrip transmission line version of the transmission line 1512 when the magnetic structure 1904 is used. The third graph 3006 is a zoomed-in view of the first plot 3010 and the second plot 3012 within a first zoom-in region 3018 of the first graph 3002. A first comparison region 3022 of the third graph 3006 indicates that impedance of the microstrip transmission line version of the transmission line 1512 is increased from about 170Ω to about 270Ω at about 200 MHz when the magnetic structure 1904 is used, thus providing an about 83% increase in impedance at operational frequencies below about 200 MHz.

The second graph 3004 has a third plot 3014 of impedance values for a coplanar waveguide transmission line version of the transmission line 1512, such as a copper transmission line, when the magnetic structure 1904 is not used. The second graph 3004 has a fourth plot 3016 of impedance values for the coplanar waveguide transmission line version of the transmission line 1512 when the magnetic structure 1904 is used. The fourth graph 3008 is a zoomed-in view of the third plot 3014 and the fourth plot 3016 within a second zoom-in region 3020 of the second graph 3004. A second comparison region 3024 of the fourth graph 3008 indicates that impedance of the coplanar waveguide transmission line version of the transmission line 1512 is increased from about 125Ω to about 220Ω at about 200 MHz when the magnetic structure 1904 is used, thus providing an about 55% increase in impedance at operational frequencies below about 200 MHz.

According to one or more embodiments, a semiconductor arrangement in fan out packaging comprises a molding compound adjacent a side of a semiconductor die. In one or more embodiments, the semiconductor arrangement comprises a magnetic structure disposed above the molding compound, above the semiconductor die, and around a transmission line coupled to an integrated circuit of the semiconductor die. In one or more embodiments, the magnetic structure comprises a top magnetic portion, a bottom magnetic portion, a first side magnetic portion, and a second side magnetic portion. In one or more embodiments, the first side magnetic portion is coupled to the top magnetic portion and to the bottom magnetic portion. In one or more embodiments, the second side magnetic portion is coupled to the top magnetic portion and to the bottom magnetic portion. In one or more embodiments, the first side magnetic portion is opposite the second side magnetic portion relative to the transmission line. In one or more embodiments, at least one of the first side magnetic portion or the second side magnetic portion has a tapered sidewall.

According to one or more embodiments, a semiconductor arrangement in fan out packaging comprises a transmission line coupled to an integrated circuit of a semiconductor die, wherein a die attach film is disposed on a backside of the semiconductor die. In one or more embodiments, the semiconductor arrangement comprises a magnetic structure disposed within a dielectric layer and positioned around the transmission line. In one or more embodiments, the magnetic structure comprises a top magnetic portion, a bottom magnetic portion, a first side magnetic portion, and a second side magnetic portion. In one or more embodiments, the first side magnetic portion is coupled to the top magnetic portion and to the bottom magnetic portion. In one or more embodiments, the second side magnetic portion is coupled to the top magnetic portion and to the bottom magnetic portion. In one or more embodiments, the first side magnetic portion is opposite the second side magnetic portion relative to the transmission line. In one or more embodiments, at least one of the first side magnetic portion or the second side magnetic portion has a tapered sidewall.

According to one or more embodiments, a method of forming a semiconductor arrangement in fan out packaging comprises forming a bottom magnetic portion, of a magnetic structure, above a semiconductor die and above a molding compound, where the molding compound is adjacent a side of the semiconductor die. In one or more embodiments, the method of forming a semiconductor arrangement comprises forming a first opening and a second opening through a dielectric layer over the bottom magnetic portion, the first opening formed relative to a first side of a transmission line coupled to the semiconductor die, the second opening formed relative to a second side of the transmission line. In one or more embodiments, the method of forming a semiconductor arrangement comprises filling the first opening with magnetic material to form a first side magnetic portion, of the magnetic structure, the first side magnetic portion coupled to the bottom magnetic portion. In one or more embodiments, the method of forming a semiconductor arrangement comprises filling the second opening with magnetic material to form a second side magnetic portion, of the magnetic structure, the second side magnetic portion coupled to the bottom magnetic portion. In one or more embodiments, the forming a semiconductor arrangement comprises forming a top magnetic portion, of the magnetic structure, over the first side magnetic portion and the second side magnetic portion, the top magnetic portion coupled to the first side magnetic portion and the second side magnetic portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in one or more embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in one or more embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement in fan out packaging, comprising:
    molding compound adjacent a side of a semiconductor die; and
    a magnetic structure disposed above the molding compound, above the semiconductor die, and around a transmission line coupled to an integrated circuit of the semiconductor die, the magnetic structure comprising:
        a top magnetic portion;
        a bottom magnetic portion disposed below the top magnetic portion;
        a first side magnetic portion coupled to the top magnetic portion and to the bottom magnetic portion; and
        a second side magnetic portion coupled to the top magnetic portion and to the bottom magnetic portion, wherein:
            the magnetic structure comprises at least one of iron or zirconium,
            the first side magnetic portion is disposed on a first side of the transmission line,
            the second side magnetic portion is disposed on a second side of the transmission line,
            the first side of the transmission line is opposite the second side of the transmission line,
            at least one of the first side magnetic portion or the second side magnetic portion has a tapered sidewall, an uppermost surface contacting the top magnetic portion, and a bottommost surface contacting the bottom magnetic portion,
            an interface is defined where the uppermost surface contacts the top magnetic portion,
            the tapered sidewall has a constant slope extending from the uppermost surface to the bottommost surface, and
            the transmission line is coupled to a current amplifier comprising:
                a first transistor coupled to the transmission line; and
                a second transistor coupled to the first transistor and coupled to a second integrated circuit.

2. The semiconductor arrangement of claim 1, comprising:
    a first dielectric layer disposed between the bottom magnetic portion and the transmission line.

3. The semiconductor arrangement of claim 2, comprising:
    a second dielectric layer disposed between the top magnetic portion and the transmission line.

4. The semiconductor arrangement of claim 1, wherein:
    the first side magnetic portion comprises a first magnetic segment and a second magnetic segment,
    the first magnetic segment and the second magnetic segment are disposed on the first side of the transmission line, and
    the semiconductor arrangement comprises a first dielectric layer in contact with the first magnetic segment and the second magnetic segment.

5. The semiconductor arrangement of claim 4, comprising:
    a second dielectric layer in contact with the first magnetic segment and the second magnetic segment and disposed above the first dielectric layer, wherein an interface is defined between the first dielectric layer and the second dielectric layer.

6. The semiconductor arrangement of claim 5, wherein:
the first dielectric layer is disposed between the bottom magnetic portion and the transmission line, and
the second dielectric layer is disposed between the top magnetic portion and the transmission line.

7. The semiconductor arrangement of claim 4, wherein:
the first dielectric layer contacts the second side magnetic portion, a sidewall of the bottom magnetic portion, and a top surface of the bottom magnetic portion.

8. The semiconductor arrangement of claim 1, comprising:
a first redistribution element on a first side of the magnetic structure; and
a second redistribution element on a second side of the magnetic structure opposite the first side of the magnetic structure.

9. The semiconductor arrangement of claim 1, wherein:
the uppermost surface contacts a bottom surface of the top magnetic portion, and
the bottom surface is planar from a point of contact with the first side magnetic portion to a point of contact with the second side magnetic portion.

10. A semiconductor arrangement in fan out packaging, comprising:
a transmission line coupled to an integrated circuit of a semiconductor die, wherein:
a die attach film is disposed on a first side of the semiconductor die,
the transmission line is disposed on a second side of the semiconductor die,
the first side of the semiconductor die is opposite the second side of the semiconductor die, and
the transmission line is coupled to a current amplifier comprising:
a first transistor coupled to the transmission line; and
a second transistor coupled to the first transistor and coupled to a second integrated circuit;
a magnetic structure disposed above the semiconductor die and positioned around the transmission line, the magnetic structure comprising:
a top magnetic portion;
a bottom magnetic portion disposed below the top magnetic portion;
a first side magnetic portion coupled to the top magnetic portion and to the bottom magnetic portion; and
a second side magnetic portion coupled to the top magnetic portion and to the bottom magnetic portion, wherein:
the first side magnetic portion is disposed on a first side of the transmission line,
the second side magnetic portion is disposed on a second side of the transmission line,
the first side of the transmission line is opposite the second side of the transmission line, and
at least one of the first side magnetic portion or the second side magnetic portion has a tapered sidewall;
a conductive pad overlying the semiconductor die and electrically coupled to the semiconductor die;
a via connector disposed over the conductive pad and electrically coupled to the conductive pad;
a first redistribution layer disposed over the via connector and electrically coupled to the via connector;
a second redistribution layer disposed over the first redistribution layer and electrically coupled to the first redistribution layer;
a first dielectric layer in which the via connector is disposed;
a second dielectric layer in which a first portion of the first redistribution layer is disposed; and
a third dielectric layer in which a second portion of the first redistribution layer, the bottom magnetic portion, a bottom portion of the first side magnetic portion, and a bottom portion of the second side magnetic portion are disposed, wherein an uppermost surface of the first redistribution layer overlies a top surface of the third dielectric layer.

11. The semiconductor arrangement of claim 10, comprising:
a fourth dielectric layer in which a bottom portion of the second redistribution layer, a top portion of the first side magnetic portion, and a top portion of the second side magnetic portion are disposed, wherein an interface is defined between the third dielectric layer and the fourth dielectric layer; and
a fifth dielectric layer in which a second portion of the second redistribution layer and the top magnetic portion are disposed.

12. The semiconductor arrangement of claim 11, comprising:
a sixth dielectric layer overlying the second redistribution layer and the top magnetic portion.

13. The semiconductor arrangement of claim 12, wherein at least one of the first dielectric layer, the second dielectric layer, the third dielectric layer, the fourth dielectric layer, the fifth dielectric layer, or the sixth dielectric layer comprises a polymer.

14. The semiconductor arrangement of claim 11, wherein a top surface of the first dielectric layer is co-planar with a top surface of the via connector.

15. The semiconductor arrangement of claim 10, wherein a top surface of the first dielectric layer is co-planar with a top surface of the via connector.

16. A semiconductor arrangement in fan out packaging, comprising:
a transmission line coupled to an integrated circuit, wherein the transmission line is coupled to a current amplifier comprising:
a first transistor coupled to the transmission line; and
a second transistor coupled to the first transistor and coupled to a second integrated circuit;
a magnetic structure disposed around the transmission line, the magnetic structure comprising:
a top magnetic portion disposed above the transmission line;
a bottom magnetic portion disposed below the transmission line;
a first side magnetic portion disposed between the top magnetic portion and the bottom magnetic portion; and
a second side magnetic portion disposed between the top magnetic portion and the bottom magnetic portion, wherein:
the first side magnetic portion comprises a first magnetic segment and a second magnetic segment,
the first magnetic segment and the second magnetic segment are disposed on a first side of the transmission line,
the second side magnetic portion is disposed on a second side of the transmission line,
the first side of the transmission line is opposite the second side of the transmission line, the first magnetic segment is spaced apart from the second magnetic segment,
at least one of a first sidewall of the first magnetic segment facing the second side magnetic portion or a second sidewall of the first magnetic segment facing away from the second side magnetic portion has a constant slope extending from an uppermost surface of the first magnetic segment contacting the top magnetic portion to a bottommost surface of the first magnetic segment contacting the bottom magnetic portion, and
an interface is defined where the uppermost surface contacts the top magnetic portion; and
a first dielectric layer, wherein the first dielectric layer is disposed between the transmission line and the bottom magnetic portion such that, along a vertical line perpendicular to a top surface of the bottom magnetic portion and intersecting the transmission line, the first dielectric layer is in direct contact with a bottom surface of the transmission line and the top surface of the bottom magnetic portion.

17. The semiconductor arrangement of claim 16,
wherein the first dielectric layer is disposed between the first magnetic segment and the second magnetic segment.

18. The semiconductor arrangement of claim 17, comprising:
a second dielectric layer disposed above the first dielectric layer and between the transmission line and the top magnetic portion, wherein the second dielectric layer is disposed between the first magnetic segment and the second magnetic segment.

19. The semiconductor arrangement of claim 17, wherein the first dielectric layer is disposed between the transmission line and the first side magnetic portion.

20. The semiconductor arrangement of claim 16, wherein the first sidewall and the second sidewall are tapered.

\* \* \* \* \*